United States Patent
Lee et al.

(10) Patent No.: US 12,080,693 B2
(45) Date of Patent: Sep. 3, 2024

(54) DISPLAY DEVICE INCLUDING DIFFERENT ALIGNMENT WIRINGS IN DIFFERENT ALIGNMENT AREAS AND METHOD OF MANUFACTURING THE SAME

(71) Applicant: Samsung Display Co., Ltd., Yongin-si (KR)

(72) Inventors: Won Ho Lee, Suwon-si (KR); Yo Han Lee, Hwaseong-si (KR); Jong Hyuk Kang, Suwon-si (KR); Jin Oh Kwag, Yongin-si (KR); Hyun Deok Im, Seoul (KR); Hyun Min Cho, Seoul (KR); Won Kyu Kim, Seoul (KR); Keun Kyu Song, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 585 days.

(21) Appl. No.: 17/277,270

(22) PCT Filed: May 29, 2019

(86) PCT No.: PCT/KR2019/006456
§ 371 (c)(1),
(2) Date: Mar. 17, 2021

(87) PCT Pub. No.: WO2020/060002
PCT Pub. Date: Mar. 26, 2020

(65) Prior Publication Data
US 2022/0037299 A1    Feb. 3, 2022

(30) Foreign Application Priority Data
Sep. 21, 2018 (KR) .................. 10-2018-0114428

(51) Int. Cl.
*H01L 25/16* (2023.01)
*H01L 27/12* (2006.01)

(52) U.S. Cl.
CPC .......... *H01L 25/167* (2013.01); *H01L 27/124* (2013.01)

(58) Field of Classification Search
CPC ..... H01L 25/167; H01L 27/124; H01L 33/44; H01L 27/156; H01L 33/62
(Continued)

(56) References Cited

U.S. PATENT DOCUMENTS 9,329,433 B2   5/2016 Negishi et al.
9,935,241 B2   4/2018 Do et al.
(Continued)

FOREIGN PATENT DOCUMENTS

CN   106558646 A   4/2017
CN   107134221 A   9/2017
(Continued)

OTHER PUBLICATIONS

Office action issued in corresponding Chinese Patent Application No. 201980062187.9, dated Jan. 31, 2024, 7pp.

*Primary Examiner* — Didarul A Mazumder
(74) *Attorney, Agent, or Firm* — Lewis Roca Rothgerber Christie LLP

(57) ABSTRACT

A display device and a method of manufacturing the same are provided. The display device comprises a first area which extends in a first direction, a second area which extends in the first direction and is alongside the first area in a second direction intersecting the first direction, at least one first light emitting element in the first area, at least one second light emitting element in the second area, at least one first wiring coupled to an end of the first light emitting element in the first area and that extends in the first direction and at least one second wiring coupled to an end of the second light emitting element in the second area and that
(Continued)

extends in the first direction, wherein the first wiring and the second wiring are electrically isolated from each other.

20 Claims, 15 Drawing Sheets

(58) Field of Classification Search
USPC .............................. 257/88; 438/22, 24, 46, 47
See application file for complete search history.

(56) References Cited

U.S. PATENT DOCUMENTS

| | | |
|---|---|---|
| 2007/0085787 A1 | 4/2007 | Kim |
| 2013/0027623 A1 | 1/2013 | Negishi et al. |
| 2015/0363016 A1 | 12/2015 | Furutani |
| 2017/0092691 A1 | 3/2017 | Tso |
| 2017/0200859 A1 | 7/2017 | Do et al. |
| 2017/0228080 A1 | 8/2017 | Furutani |
| 2017/0250168 A1* | 8/2017 | Do .......................... H01L 33/38 |
| 2018/0019369 A1 | 1/2018 | Cho et al. |
| 2018/0061869 A1 | 3/2018 | Suzuki et al. |
| 2018/0090037 A1 | 3/2018 | Tso et al. |
| 2018/0175009 A1 | 6/2018 | Kim et al. |
| 2018/0175106 A1* | 6/2018 | Kim ...................... H01L 33/385 |

FOREIGN PATENT DOCUMENTS

| | | |
|---|---|---|
| JP | 2011-211047 A | 10/2011 |
| JP | 2016-004281 A | 1/2016 |
| JP | 2018-033031 A | 3/2018 |
| KR | 10-1628345 B1 | 6/2016 |
| KR | 10-1711187 B1 | 3/2017 |
| KR | 10-2017-0083191 A | 7/2017 |
| KR | 10-1770632 B1 | 8/2017 |
| KR | 10-2018-0007376 A | 1/2018 |
| KR | 10-1874993 B1 | 7/2018 |

* cited by examiner

AA : AA1, AA2, AA3, AA4, AA5, AA6, AA7, AA8, AA9
700S_1 : 710S_1, 720S_1, 730S_1

DISPLAY DEVICE INCLUDING DIFFERENT ALIGNMENT WIRINGS IN DIFFERENT ALIGNMENT AREAS AND METHOD OF MANUFACTURING THE SAME

CROSS-REFERENCE TO RELATED APPLICATIONS

This application is a National Phase Patent Application and claims priority to and the benefit of International Application Number PCT/KR2019/006456, filed on May 29, 2019, which claims priority to Korean Patent Application Number 10-2018-0114428, filed on Sep. 21, 2018, the entire contents of each of which are hereby incorporated by reference.

TECHNICAL FIELD

Embodiments of the present disclosure relate to a display device and a method of manufacturing the same.

BACKGROUND ART

With the development of multimedia, display devices are becoming increasingly important. Accordingly, various types of display devices such as organic light emitting displays and liquid crystal displays are being used.

A display device is a device for displaying an image and includes a display panel such as an organic light emitting display panel or a liquid crystal display panel. Among them, the light emitting display panel may include light emitting elements such as light emitting diodes (LEDs). For example, the LEDs may be organic light emitting diodes (OLEDs) using an organic material as a fluorescent material or may be inorganic LEDs using an inorganic material as the fluorescent material.

An OLED that uses an organic material as a fluorescent material of a light emitting element can be manufactured in a simple process and may have flexible characteristics. However, the organic material is vulnerable to a high-temperature driving environment and to have a relatively low efficiency with respect to emission of blue light.

On the other hand, an inorganic LED that uses an inorganic semiconductor as the fluorescent material is durable even in a high-temperature environment and has higher blue light efficiency than the OLED. In addition, a transfer method using dielectrophoresis (DEP) has been developed for a manufacturing process which has been pointed out as a limitation of conventional inorganic LEDs. Therefore, research is being continuously conducted on inorganic LEDs having better durability and efficiency than OLEDs.

DISCLOSURE

Technical Problem

Embodiments of the present disclosure provide a display device including an alignment wiring which applies a different alignment signal to each alignment area in which light emitting elements are aligned.

Embodiments of the present disclosure provide a method of manufacturing a display device, the method being employed to minimize or reduce a voltage drop of an alignment signal applied to align light emitting elements.

However, aspects of embodiments of the present disclosure are not restricted to the ones set forth herein. The above and other aspects of embodiments of the present disclosure will become more apparent to one of ordinary skill in the art to which the present disclosure pertains by referencing the detailed description of the present disclosure given below.

Technical Solution

According to an aspect of an embodiment, a display device comprises a first area which extends in a first direction, a second area which extends in the first direction and is alongside the first area in a second direction intersecting the first direction, at least one first light emitting element which is in the first area, at least one second light emitting element which is in the second area, at least one first wiring which is coupled to an end of the first light emitting element in the first area and extends in the first direction and at least one second wiring which is coupled to an end of the second light emitting element in the second area and extends in the first direction, wherein the first wiring and the second wiring are electrically isolated from each other.

The display device may further comprise a third wiring having at least a part extending in the second direction from a first side of the first area to a second side of the second area, wherein the third wiring may comprise at least one third wiring branch portion having at least some parts extending in the first area and the second area in the first direction and spaced apart from each other and a third wiring stem portion extending in the second direction.

The third wiring branch portion may be coupled to the other end of the first light emitting element in the first area and coupled to the other end of the second light emitting element in the second area.

The first wiring may comprise a first wiring branch portion extending in the first area in the first direction and a first wiring stem portion extending in the second direction from the first side of the first area to a second side of the first area, and the second wiring may comprise a second wiring branch portion extending in the second area in the first direction and a second wiring stem portion extending in the second direction from the first side of the first area to the second side of the second area.

The display device may comprise a display area which extends in the second direction and a non-display area which extends in the second direction and is located on both sides of the display area in the first direction, wherein the first wiring stem portion, the second wiring stem portion, and the third wiring stem portion may be in the non-display area.

The non-display area may comprise a first non-display area located on a side of the display area and a second non-display area located on the other side of the display area.

The first wiring may comprise the first wiring stem portion in the first non-display area and a first sub-wiring stem portion in the second non-display area, the second wiring may comprise the second wiring stem portion in the first non-display area and a second sub-wiring stem portion in the second non-display area, and the third wiring may comprise the third wiring stem portion in the first non-display area and a third sub-wiring stem portion in the second non-display area.

The third wiring branch portion may have an end spaced apart from the third wiring stem portion and the other end spaced apart from the third sub-wiring stem portion, the first wiring branch portion may have both ends respectively coupled to the first wiring branch portion and the first sub-wiring stem portion, and the second wiring branch portion may have both ends respectively coupled to the second wiring stem portion and the second sub-wiring stem portion.

The display device may further comprise a first wiring layer which comprises the first wiring, the second wiring and the third wiring and a second wiring layer which is located on the first wiring layer and comprises a first bridge wiring coupling the first wiring stem portion and the first wiring branch portion and a second bridge wiring coupling the second wiring stem portion and the second wiring branch portion.

The display device may further comprise a third area which extends in the first direction and is located on the second side of the second area and a fourth wiring which comprises a fourth wiring stem portion extending from the first side of the first area to a second side of the third area in the first direction and a fourth wiring branch portion branching from the fourth wiring stem portion and in the third area, wherein the fourth wiring is electrically isolated from the first wiring and the second wiring.

The third wiring stem portion may extend from the first side of the first area to the second side of the third area in the first direction, and the third wiring branch portion may branch from the third wiring stem portion and be disposed in the third area.

The display device may further comprise a third light emitting element which has an end coupled to the third wiring branch portion in the third area and the other end coupled to the fourth wiring branch portion.

According to another aspect of an embodiment, a method of manufacturing a display device comprises preparing a lower substrate which comprises at least one ground wiring and an alignment wiring spaced apart from the ground wiring to face the ground wiring and aligning a light emitting element between the ground wiring and the alignment wiring by coating a coating solution containing the light emitting element on at least a part of the lower substrate and applying alternating current (AC) power to the alignment wiring, wherein the lower substrate comprises a first area extending in a first direction and a second area alongside the first area in a second direction intersecting the first direction, and the alignment wiring comprises a first alignment wiring in the first area and a second alignment wiring in the second area.

The coating solution may be coated sequentially from a first side of the first area to a second side of the second area.

The ground wiring may comprise a first ground wiring which is spaced apart from the first alignment wiring to face the first alignment wiring in the first area and a second ground wiring which is spaced apart from the second alignment wiring to face the second alignment wiring in the second area.

The light emitting element may comprise a first light emitting element aligned between the first alignment wiring and the first ground wiring and a second light emitting element aligned between the second alignment wiring and the ground wiring.

The aligning of the light emitting element may comprise aligning the light emitting element between the first alignment wiring and the first ground wiring by coating the coating solution on at least a part of the first area and applying the AC power to the first alignment wiring at a first time and aligning the light emitting element between the second alignment wiring and the second ground wiring by coating the coating solution on at least a part of the second area and applying the AC current to the second alignment wiring at a second time different from the first time.

At the first time, the AC power applied to the first alignment wiring may form a first electric field between the first alignment wiring and the first ground wiring, and the first light emitting element may have an end coupled to the first alignment wiring and the other end coupled to the first ground wiring.

At the second time, the first electric field may be removed, the AC power applied to the second alignment wiring may form a second electric field, which has substantially the same intensity as the first electric field, between the second alignment wiring and the second ground wiring, and the second light emitting element may have an end coupled to the second alignment wiring and the other end coupled to the second ground wiring.

At a third time different from the first time and the second time, the second electric field may be removed, and each of the first ground wiring and the second ground wiring may be partially patterned to form at least one fragment.

The details of other embodiments are included in the present detailed description and the drawings.

Advantageous Effects

A display device according to an embodiment includes different alignment wirings in different alignment areas. Therefore, an alignment signal is applied only to a corresponding alignment area, thereby minimizing or reducing a voltage drop that occurs during alignment of light emitting elements. In addition, when an ink containing the light emitting elements is coated, an electric field is formed only in a corresponding area. Therefore, the degree of alignment of the light emitting elements can be improved.

Advantageous effects according to the present disclosure are not limited to those mentioned above, and various other advantageous effects are included herein.

MODES OF THE INVENTION

Embodiments of the present disclosure will now be described more fully hereinafter with reference to the accompanying drawings, in which certain embodiments of the disclosure are shown. The subject matter of this disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the attached drawings.

Figure 1:
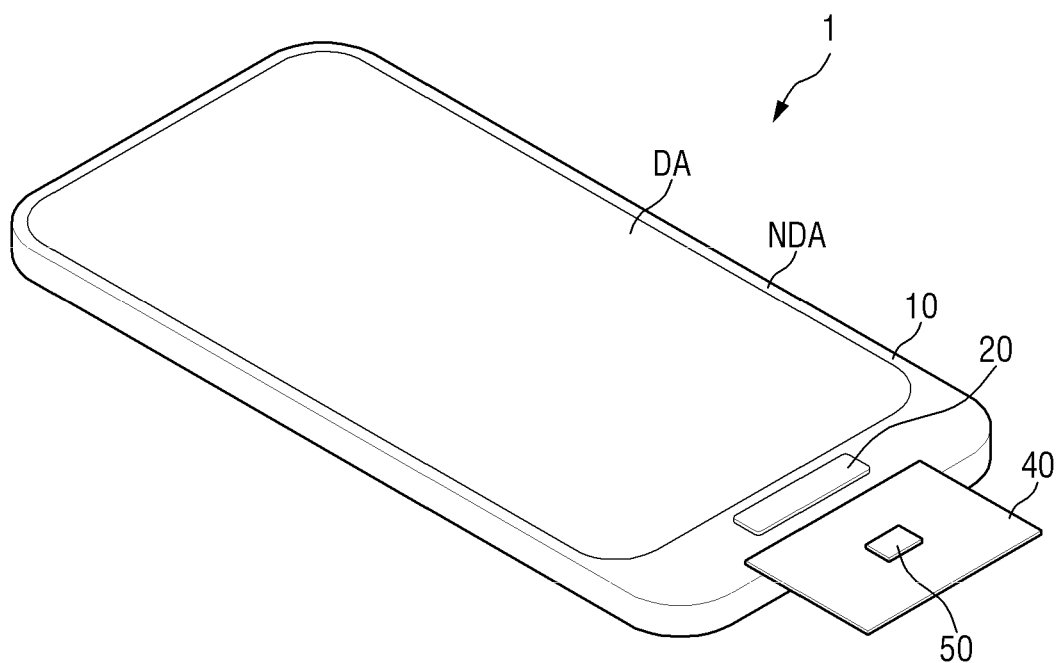
FIG. 1 is a perspective view of a display device according to an embodiment.
Figure 2:
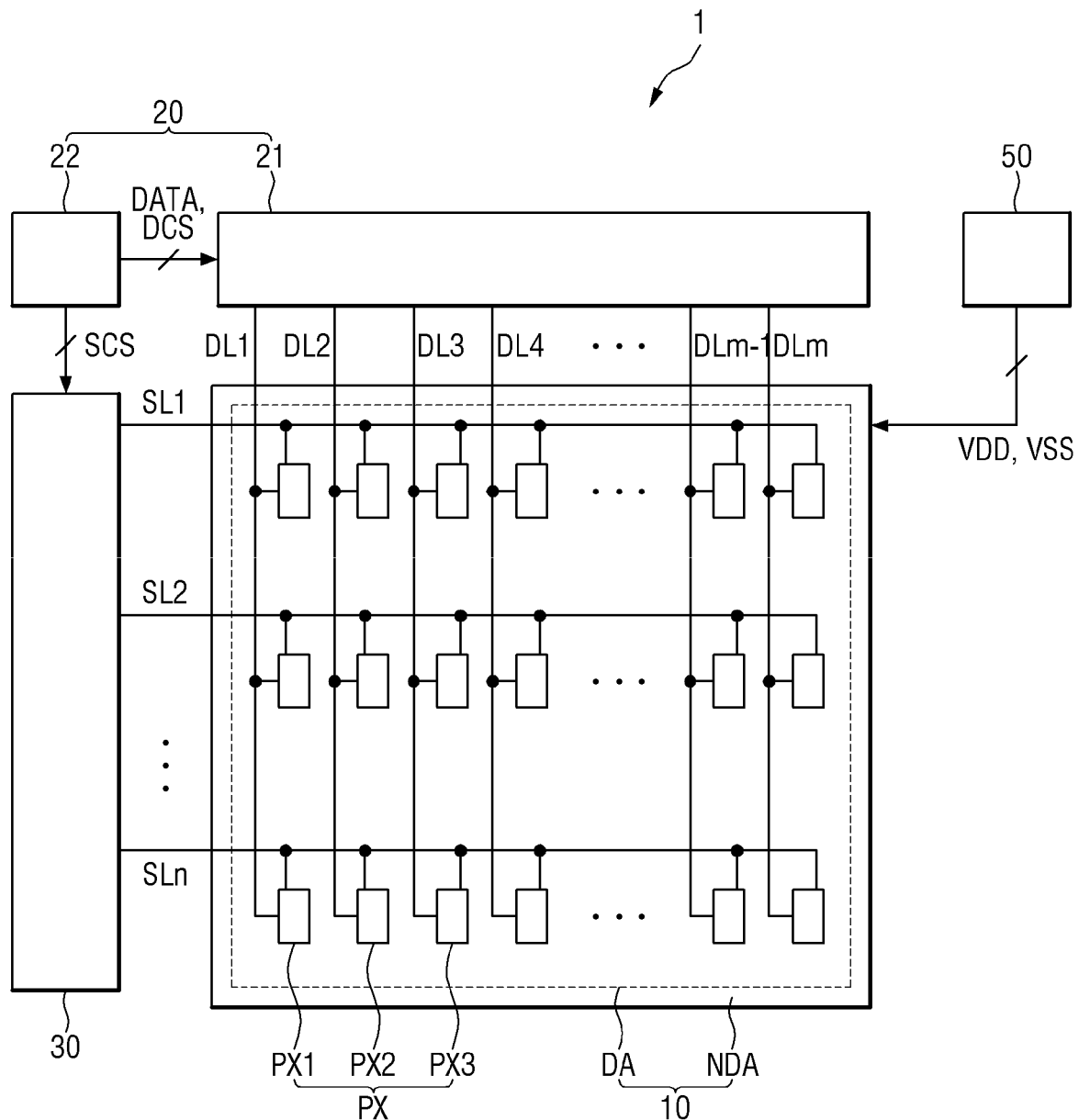
FIG. 2 is a schematic block diagram of the display device according to the embodiment.
Figure 3:
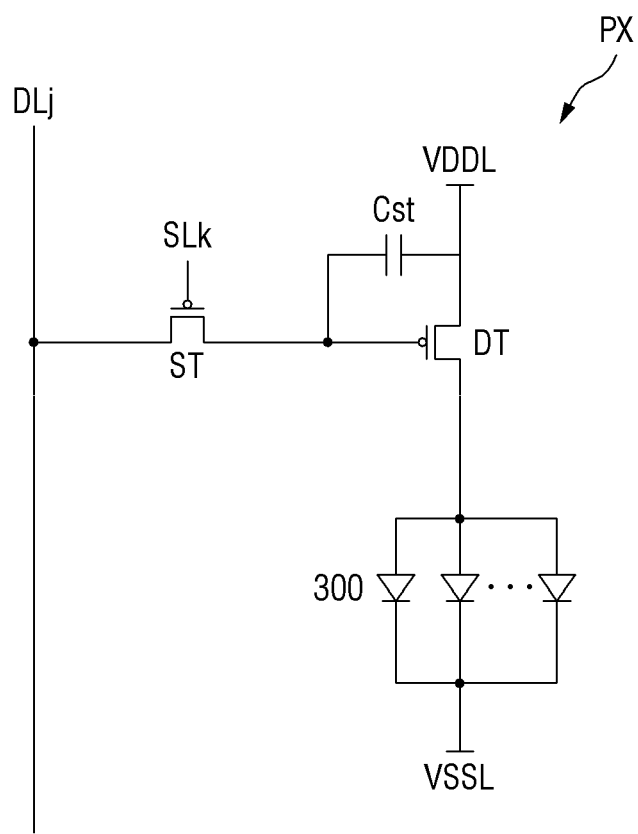
FIG. 3 is a circuit diagram of one pixel of FIG. 2.

FIG. 1 is a perspective view of a display device according to an embodiment. FIG. 2 is a schematic block diagram of the display device according to the embodiment. FIG. 3 is a circuit diagram of one pixel of FIG. 2.

Referring to FIGS. 1 through 3, the display device 1 according to the embodiment includes a display panel 10, an integrated driver circuit 20, a scan driver 30, a circuit board 40, and a power supply circuit 50. The integrated driver circuit 20 may include a data driver 21 and a timing controller 22.

In the present specification, the terms "on," "top," and "upper surface" indicate a Z-axis direction, and the terms "under," "bottom," and "lower surface" indicate a direction opposite to the Z-axis direction. In addition, "left," "right," "up," and "down" indicate directions when the display panel 10 is viewed in a plane. For example, "left" indicates a direction opposite to an X-axis direction (or a negative X-axis direction), "right" indicates the X-axis direction (or a positive X-axis direction), "up" indicates a Y-axis direction (or a positive Y-axis direction), and "down" indicates a direction opposite to the Y-axis direction (or a negative Y-axis direction).

The display panel 10 may be rectangular in a plan view. For example, the display panel 10 may have a rectangular planar shape having short sides in a first direction (X-axis direction) and long sides in a second direction (Y-axis direction) as illustrated in FIG. 1. Each corner where a short side extending in the first direction (X-axis direction) meets a long side extending in the second direction (Y-axis direction) may be right-angled or may be rounded with a set or predetermined curvature. The planar shape of the display panel 10 is not limited to the rectangular shape, but may also be another polygonal shape, a circular shape, or an elliptical shape. In addition, although the display panel 10 is formed flat in FIG. 1, the present disclosure is not limited to this case. At least one side of the display panel 10 may also be bent to have a set or predetermined curvature.

The display panel 10 may be divided into a display area DA and a non-display area NDA around the display area DA. The display area DA is an area where a plurality of pixels PX are formed to display an image. The display panel 10 may include data lines D1 through Dm (where m is an integer equal to or greater than 2), scan lines S1 through Sn (where n is an integer equal to or greater than 2), a first voltage line VDDL provided with a first voltage, a second voltage line VSSL provided with a second voltage, and the pixels PX coupled to the data lines D1 through Dm and the scan lines S1 through Sn.

Each of the pixels PX may display a color by including one or more light emitting elements 300 which emit light of a set or specific wavelength band. Light emitted from the light emitting elements 300 may be displayed through the display area DA of the display panel 10.

Each of the pixels PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. The first color may be red, the second color may be green, and the third color may be blue, but the present disclosure is not limited to this case. In addition, although each of the pixels PX includes three subpixels in FIG. 2, the present disclosure is not limited to this case. For example, each of the pixels PX may also include four or more subpixels.

In an embodiment, subpixels PX that display different colors may include light emitting elements 300 that emit light of different colors. For example, the first subpixel PX1 that displays red may include light emitting elements 300 that emit red light, the second subpixel PX2 that displays green may include light emitting elements 300 that emit green light, and the third subpixel PX3 that displays blue may include light emitting elements 300 that emit blue light. However, the present disclosure is not limited to this case. In some cases, pixels that display different colors may include light emitting elements 300 that emit light of the same (e.g., substantially the same) color (e.g., blue), and a wavelength conversion layer or a color filter may be placed on a light emission path to realize the color of each pixel. However, the present disclosure is not limited to this case. In some cases, adjacent pixels PX may emit light of the same (e.g., substantially the same) color.

Each of the first subpixel PX1, the second subpixel PX2, and the third subpixel PX3 may be coupled to at least one selected from the data lines DL1 through DLm, at least one selected from the scan lines SL1 through SLn, and the first voltage line VDDL. Each of the first subpixel PX1, the second subpixel PX2, and the third subpixel PX3 may include the light emitting elements 300, a plurality of transistors for supplying current to the light emitting elements 300, and at least one capacitor as illustrated in FIG. 3.

The transistors may include a driving transistor DT for supplying current to the light emitting elements 300 and a switching transistor ST for supplying a data voltage to a gate electrode of the driving transistor DT, as illustrated in FIG. 3. The driving transistor DT may include the gate electrode coupled to a source electrode of the scan transistor ST, a source electrode coupled to the first voltage line VDDL provided with the first voltage, and a drain electrode coupled to first electrodes of the light emitting elements 300. The scan transistor ST may include a gate electrode coupled to a scan line SLk (where k is an integer satisfying 1≤k≤n), the source electrode coupled to the gate electrode of the driving transistor DT, and a drain electrode coupled to a data line DLj (where j is an integer satisfying 1≤j≤m).

The capacitor Cst is formed between the gate electrode and the source electrode of the driving transistor DT. The storage capacitor Cst stores a difference between a gate voltage and a source voltage of the driving transistor DT.

The driving transistor DT and the switching transistor ST may be formed as thin-film transistors. In addition, although the driving transistor DT and the switching transistor ST are formed as P-type metal oxide semiconductor field effect transistors (MOSFETs) in FIG. 3, the present disclosure is not limited to this case. The driving transistor DT and the switching transistor ST can also be formed as N-type MOSFETs. In this case, the source electrode and the drain electrode of each of the driving transistor DT and the switching transistor ST may be changed.

In addition, each of the first subpixel PX1, the second subpixel PX2, and the third subpixel PX3 has a 2 transistor-1 capacitor (2T1C) structure including one driving transistor DT, one switching transistor ST and one capacitor Cst in FIG. 3. However, the present disclosure is not limited to this case. Each of the first subpixel PX1, the second subpixel PX2 and the third subpixel PX3 can also include a plurality of scan transistors ST and a plurality of capacitors Cst.

The integrated driver circuit 20 outputs signals and voltages for driving the display panel 10. To this end, the integrated driver circuit 20 may include the data driver 21 and the timing controller 22.

The data driver 21 receives digital video data DATA and a source control signal DCS from the timing controller 22. The data driver 21 converts the digital video data DATA into analog data voltages according to the source control signal DCS and supplies the analog data voltages to the data lines DL1 through DLm of the display panel 10.

The timing controller 22 receives the digital video data DATA and timing signals from a host system. The timing signals may include a vertical sync signal, a horizontal sync signal, a data enable signal, and a dot clock. The host system may be an application processor of a smartphone or a tablet PC or may be a system-on-chip of a monitor or a TV.

The timing controller 22 generates control signals for controlling the operation timing of the data driver 21 and the scan driver 30. The control signals may include the source control signal DCS for controlling the operation timing of the data driver 21 and a scan control signal for controlling the operation timing of the scan driver 30.

The integrated driver circuit 20 may be in the non-display area NDA on a side of the display panel 10. The integrated driver circuit 20 may be formed as an integrated circuit and mounted on the display panel 10 by a chip-on-glass (COG) method, a chip-on-plastic (COP) method, or an ultrasonic bonding method. However, the present disclosure is not limited to this case. For example, the integrated driver circuit 20 may be mounted on the circuit board 40, not on the display panel 10.

In addition, although the integrated driver circuit 20 includes the data driver 21 and the timing controller 22 in FIG. 1, the present disclosure is not limited to this case. The data driver 21 and the timing controller 22 may also be formed as separate integrated circuits instead of being integrated into one integrated circuit. In this case, the data driver 21 may be mounted on the display panel 10 by the COG method, the COP method, or the ultrasonic bonding method, and the timing controller 22 may be mounted on the circuit board 40.

The scan driver 30 receives the scan control signal SCS from the timing controller 22. The scan driver 30 generates scan signals according to the scan control signal SCS and supplies the scan signals to the scan lines S1 through Sn of the display panel 10. The scan driver 30 may include a plurality of transistors and may be formed in the non-display area NDA of the display panel 10. Alternatively, the scan driver 30 may be formed as an integrated circuit. In this case, the scan driver 30 may be mounted on a gate flexible film attached to another side of the display panel 10.

The circuit board 40 may be attached onto pads provided at an edge of the display panel 10 by an anisotropic conductive film. Accordingly, lead lines of the circuit board 40 may be electrically coupled to the pads. The circuit board 40 may be a flexible printed circuit board, a printed circuit board, or a flexible film such as a chip-on-film. The circuit board 40 may be bent toward a bottom surface of the display panel 10. In this case, a side of the circuit board 40 may be attached to the edge of the display panel 10, and the other side of the circuit board 40 may be under the display panel 10 and coupled to a system board on which the host system is mounted.

The power supply circuit 50 may generate voltages necessary for driving the display panel 10 from main power received from the system board and supply the voltages to the display panel 10. For example, the power supply circuit 50 may generate the first voltage VDD and the second voltage VSS for driving the light emitting elements 300 of the display panel 10 from the main power and supply the first voltage VDD and the second voltage VSS to the first voltage line VDDL and the second voltage line VSSL of the display panel 10. In addition, the power supply circuit 50 may generate and supply driving voltages for driving the integrated driver circuit 20 and the scan driver 30 from the main power.

Although the power supply circuit 50 is formed as an integrated circuit and mounted on the circuit board 40 in FIG. 1, embodiments of the present disclosure are not limited to this case. For example, the power supply circuit 50 may also be integrated into the integrated driver circuit 20.

Figure 4:
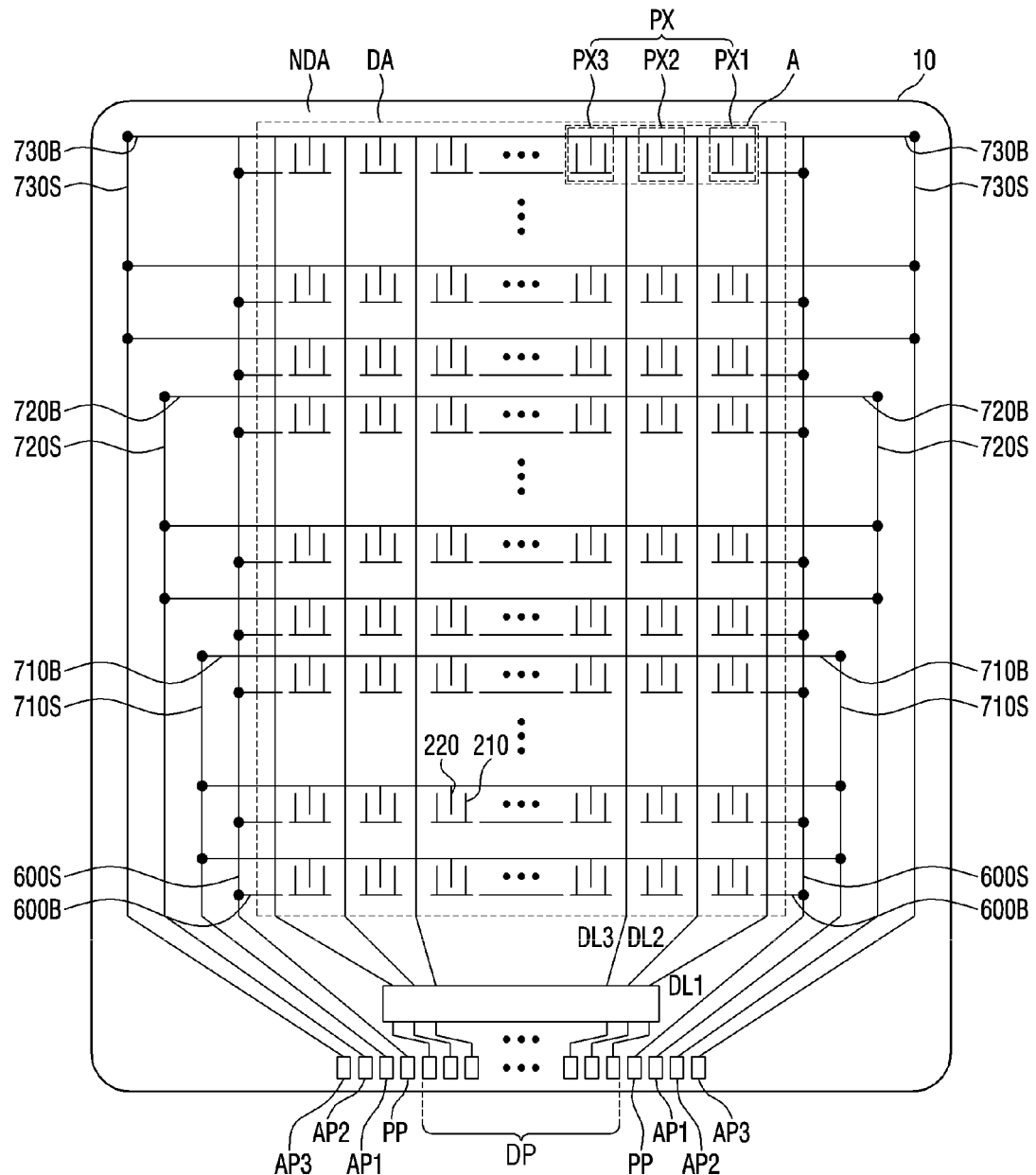
FIG. 4 is a plan view of a display panel according to an embodiment.

FIG. 4 is a plan view of a display panel according to an embodiment. FIG. 4 is an enlarged plan view of the display panel of the display device illustrated in FIG. 1.

Referring to FIG. 4, the display panel 10 includes a display area DA and a non-display area NDA. A plurality of pixels PX may be in the display area DA, and each of the pixels PX may include a plurality of electrodes 210 and 220 and light emitting elements 300 aligned between the electrodes 210 and 220. The pixels PX may be arranged in a first direction D1 which is a horizontal direction in the drawing and a second direction D2 which is a vertical direction. In portion A of FIG. 4, three subpixels PX1 through PX3 are illustrated as an example. However, it should be apparent to those of ordinary skill in the art that the display panel 10 can include more pixels PX or more subpixels PX1 through PX3.

In addition, the pixels PX of FIG. 4 may be divided into a plurality of pixels, each forming one pixel PX. The pixels may not necessarily be arranged parallel to each other in the first direction D1 and the second direction D2 as in FIG. 4, but may also be arranged in various suitable structures such as a zigzag structure. Each pixel PX or subpixel PX1, PX2 or PX3 will be described in more detail herein below with reference to FIG. 6.

The non-display area NDA is an area where no pixel PX is provided and may be defined as an area excluding the display area DA from the display panel 10. The non-display area NDA may be covered by certain members so as not to be visible from the outside of the display panel 10. Various suitable members for driving the light emitting elements 300 in the display area DA may be in the non-display area NDA. As illustrated in FIG. 4, a plurality of pads DP, AP and PP may be on a side of the display area DA of the display panel 10, for example, in an upper part of the display area NDA in a plan view.

The pads may include data transmission pads DP, power pads PP, and signal application pads AP. The data transmission pads DP may be coupled to a plurality of data lines DL extending to the pixels PX of the display area DA. The data transmission pads DP may transmit data signals for driving the pixels PX to the pixels PX through the data lines DL, respectively. One data transmission pad DP may be coupled to one data line DL, and the display panel 10 may include a number of data transmission pads DP equal to the number of subpixels PXn arranged along the first direction D1 of the display area DA.

The power pads PP may be coupled to a ground wiring 600 which will be further described herein below. The power pads PP may transmit a power supply voltage through the ground wiring 600 when the display panel 10 is driven and may be grounded when the display panel 10 is manufactured. The signal application pads AP may be coupled to an alignment wiring 700 which will be further described herein below and may receive an alignment signal when the display panel 10 is manufactured. The ground wiring 600 and the alignment wiring 700 may form an electric field-induced capacitance in the display area DA in response to alignment signals respectively received from the power pads PP and the signal application pads AP. Accordingly, the light emitting elements 300 coated on the display area DA may be aligned between the ground wiring 600 and the alignment wiring 700.

In addition, although not illustrated in the drawing, the display panel 10 may further include a first voltage line VDDL and a second voltage line VSSL for applying a first voltage VDD and a second voltage VSS to each pixel PX or subpixel PXn. Each of the first voltage line VDDL and the second voltage line VSSL may have a side coupled to another pad (not illustrated) so as to apply a set or predetermined voltage to each pixel PX or subpixel PXn. For ease of description, the first voltage line VDDL and the second voltage VSSL are not illustrated in the following drawings.

A plurality of wirings may be in parts of an area other than the area where the pads DP, AP and PP are in the non-display area NDA, for example, in parts NDA1 and NDA2 of the non-display area NDA located on a left side and a right side of the display area DA in a plan view.

The wirings include at least one ground wiring 600 and at least one alignment wiring 700. In the non-display area NDA of the display panel 10, at least one ground wiring 600 and at least one alignment wiring 700 spaced apart from the ground wiring 600 are included. They may apply set or predetermined alignment signals for aligning the light emitting elements 300 in the display area DA of the display panel 10.

The ground wiring 600 may include one or more ground wiring stem portions 600S extending in the second direction D2 and one or more ground wiring branch portions 600B branching from the ground wiring stem portions 600S and extending in the first direction D1.

The ground wiring stem portions 600S may be outside the display area DA in the drawing, for example, in the non-display area NDA located on both sides of the display area DA in the first direction D1. In FIG. 4, the ground wiring stem portions 600S are respectively in the non-display area NDA on both sides of the display area DA such that a total of two wirings form one pair. The ground wiring stem portions 600S that form one pair may have a symmetrical structure with respect to the display area DA, but the present disclosure is not limited to this case.

One or more ground wiring branch portions 600B branch from each of the ground wiring stem portions 600S. The ground wiring branch portions 600B may branch from the ground wiring stem portions 600S in the non-display area NDA toward the display area DA and extend in the first direction D1. For example, the ground wiring branch portions 600B may be in the display area DA. In other words, the ground wiring 600 may include a pair of ground alignment wirings 600S and one or more ground wiring branch portions 600B between the ground wiring stem portions 600S. However, the present disclosure is not limited to this case, and the display panel 10 may also include more ground wiring stem portions 600S, and the ground wiring stem portions 600S may also be in the display area DA in some cases.

In addition, as illustrated in the drawing, each ground wiring branch portion 600B may extend in the first direction D1, and one or more fragments may be arranged at set or predetermined intervals to form a pattern. This structure of each ground wiring branch portion 600B may be formed by patterning a ground wiring branch portion 600B into one or more fragments when the display panel 10 is manufactured.

In other words, the ground wiring branch portions 600B may branch from the ground wiring stem portions 600S, and both ends of each ground wiring branch portion 600B may extend in the first direction D1 to be substantially coupled to the ground wiring stem portions 600S. Then, each ground wiring branch portion 600B may be patterned by an additional process into a plurality of fragments which are arranged along one row. This will be described in more detail herein below.

The alignment wiring 700 includes alignment wiring stem portions 700S extending in the second direction D2 and alignment wiring branch portions 700B branching from the alignment wiring stem portions 700S and extending in the first direction D1.

The alignment wiring stem portions 700S may be outside the display area DA in the drawing, for example, in the non-display area NDA located on both sides of the display area DA in the first direction D1. The alignment wiring stem portions 700S may extend in the second direction D2 and may be spaced apart from the ground wiring stem portions 600S. For example, the alignment wiring stem portions 700S may be substantially parallel to the ground wiring stem portions 600S. In addition, the alignment wiring stem portions 700S may respectively be on both sides of the display area DA in the first direction D1. In FIG. 4, a total of six alignment wiring stem portions 700S, three on each of both sides, are in the non-display area NDA. For example, three pairs of alignment wiring stem portions 700S are on the display panel 10 of FIG. 4. Two alignment wiring stem portions 700S may form one pair in the alignment wiring 700 as in the ground wiring 600, and the display panel 10 may include one or more pairs of alignment wiring stem portions 700S. The alignment wiring stem portions 700S that form one or more pairs may be provided symmetrically with respect to the display area DA.

However, the present disclosure is not limited to this case, and the number of alignment wiring stem portions 700 in the display panel 10 can vary. According to an embodiment, the display panel 10 may include two or more alignment wiring stem portions 700S, and the alignment wiring stem portions 700S may form at least two pairs of alignment wirings 700.

The alignment wiring stem portions 700S and the ground wiring stem portions 600S are spaced apart from each other. The gaps between them need not necessarily be equal and may also be different in some cases. For example, a wiring in the non-display area NDA at a position further out from the display area DA may be spaced apart from an adjacent wiring by a larger gap. In addition, in FIG. 4, each ground wiring stem portion 600S is on a side of the non-display area NDA adjacent to the display area DA, and the alignment wiring stem portions 700S are adjacent to the other side. However, the present disclosure is not limited to this case, and the alignment wiring stem portions 700S may also be on the side adjacent to the display area DA.

One or more alignment wiring branch portions 700B branch from each of the alignment wiring stem portions 700S. The alignment wiring branch portions 700B may branch from the alignment wiring stem portions 700S in the non-display area NDA toward the display area DA and extend in the first direction D1. For example, the alignment wiring branch portions 700B may be in the display area DA.

Unlike the ground wiring branch portions 600B, each of the alignment wiring branch portions 700B may extend in the display area DA in the first direction D1 to form one wiring. For example, each of the alignment wiring branch portions 700B may not be patterned into one or more fragments when the display panel 10 is manufactured. Accordingly, both ends of each alignment wiring branch portion 700B may extend in the first direction D1 and may be electrically coupled to the alignment wiring stem portions 700S. However, the present disclosure is not limited to this case, and each of the alignment wiring branch portions 700B may also be patterned into one or more fragments, like the ground wiring branch portions 600B.

The alignment wiring branch portions 700B are spaced apart from the ground wiring branch portions 600B to face the ground wiring branch portions 600B in the display area DA. Each ground wiring branch portions 600B and each alignment wiring branch portions 700B may include a plurality of branches extending to each other in the second direction D2. One or more light emitting elements 300 may be aligned between these branches, and both ends of each of the light emitting elements 300 may be coupled to the branches, respectively. As will be further described herein below, the branches of each ground wiring branch portion 600B and each alignment wiring branch portion 700B may form first and second electrodes 210 and 220 of the light emitting elements 300.

The pads PP and AP to which set or predetermined electrical signals are applied may be coupled to respective sides of the ground wiring stem portions 600S and the alignment wiring stem portions 700S. The ground wiring stem portions 600S may be coupled to the power pads PP to receive a power signal or may be grounded. The alignment wiring stem portions 700S may be coupled to the signal application pads AP to receive an alignment signal. As will be further described herein below, the light emitting elements 300 arranged in the display area DA of the display panel 10 may receive alignment signals from the ground wiring 600 and the alignment wiring 700 and may be aligned by dielectrophoresis. Here, any one of the ground wiring 600 and the alignment wiring 700 may be grounded, and the other one may receive alternating current (AC) power for alignment signal. The received AC power may form an electric field-induced capacitance between the ground wiring 600 and the alignment wiring 700, and the light emitting elements 300 may be aligned with a dielectrophoretic force transmitted by the electric field-induced capacitance.

In the alignment wiring 700 to which the AC power is applied, the voltage of the AC power may decrease from a side coupled to the signal application pads AP toward the other side. When a voltage difference between the ground wiring 600 and the alignment wiring 700 is small, a sufficient dielectrophoretic force for aligning the light emitting elements 300 may not be transmitted. In addition, when the large-area display panel 10 is manufactured, the time for applying the AC power may be delayed depending on an area in the display panel 10, and the amount of current required to align the light emitting elements 300 may also be increased.

On the other hand, the display panel 10 according to the embodiment may include a plurality of alignment wirings 710 through 730 extending from a side coupled to the signal application pads AP toward the other side by different lengths. A plurality of alignment areas AA (see FIG. 5) may be defined on the display panel 10, and the display panel 10 may include a plurality of alignment wirings 710 through 730 extending from a side of the display panel 10 to the alignment areas AA, respectively. Accordingly, when the light emitting elements 300 are aligned in each alignment area AA during the manufacture of the display panel 10, alignment signals can be applied through the alignment wirings 710 through 730 extending to different alignment areas AA. The alignment wirings 710 through 730 may remove unnecessary resistance, thereby minimizing or reducing the voltage drop of an alignment signal applied to an alignment area AA.

According to an embodiment, the alignment wiring 700 may include a first alignment wiring 710, a second alignment wiring 720 and a third alignment wiring 730 extending from a side of the display panel 10 to the other side and having different lengths. The first, second and third alignment wirings 710, 720 and 730 may include first, second and third alignment wiring stem portions 710S, 720S and 730S and first, second and third alignment wiring branch portions 710B, 720B and 730B, respectively. The arrangement of these members is as described above.

Respective sides of the first alignment wiring stem portions 710S, the second alignment wiring stem portions 720S and the third alignment wiring stem portions 730S may be coupled to the signal application pads AP, for example, first signal application pads AP1, second signal application pads AP2 and third signal application pads AP3 on a side of the display panel 10. The alignment wiring stem portions 710S through 730S may receive different alignment signals from different signal application pads AP1 through AP3, respectively.

The alignment wiring stem portions 710S through 730S may include one or more wirings having different lengths in the non-display area NDA and extending in the second direction D2. For example, the other sides of the alignment wiring stem portions 710S through 730S may extend in the second direction D2 and have different lengths. The alignment wiring stem portions 710S through 730S different from each other may respectively include the alignment wiring branch portions 710B through 730B branching toward the display area DA and extending in the first direction D1.

Each of the alignment wiring stem portions 710S through 730S may be on each of both sides of the display area DA to form one pair. In addition, each pair of alignment wiring stem portions 710S, 720S or 730S may be electrically coupled by each alignment wiring branch portions 710B, 720B or 730B extending in the first direction D1. The structures of the alignment wirings 710 through 730 will be described in more detail with reference to FIG. 5.

Figure 5:
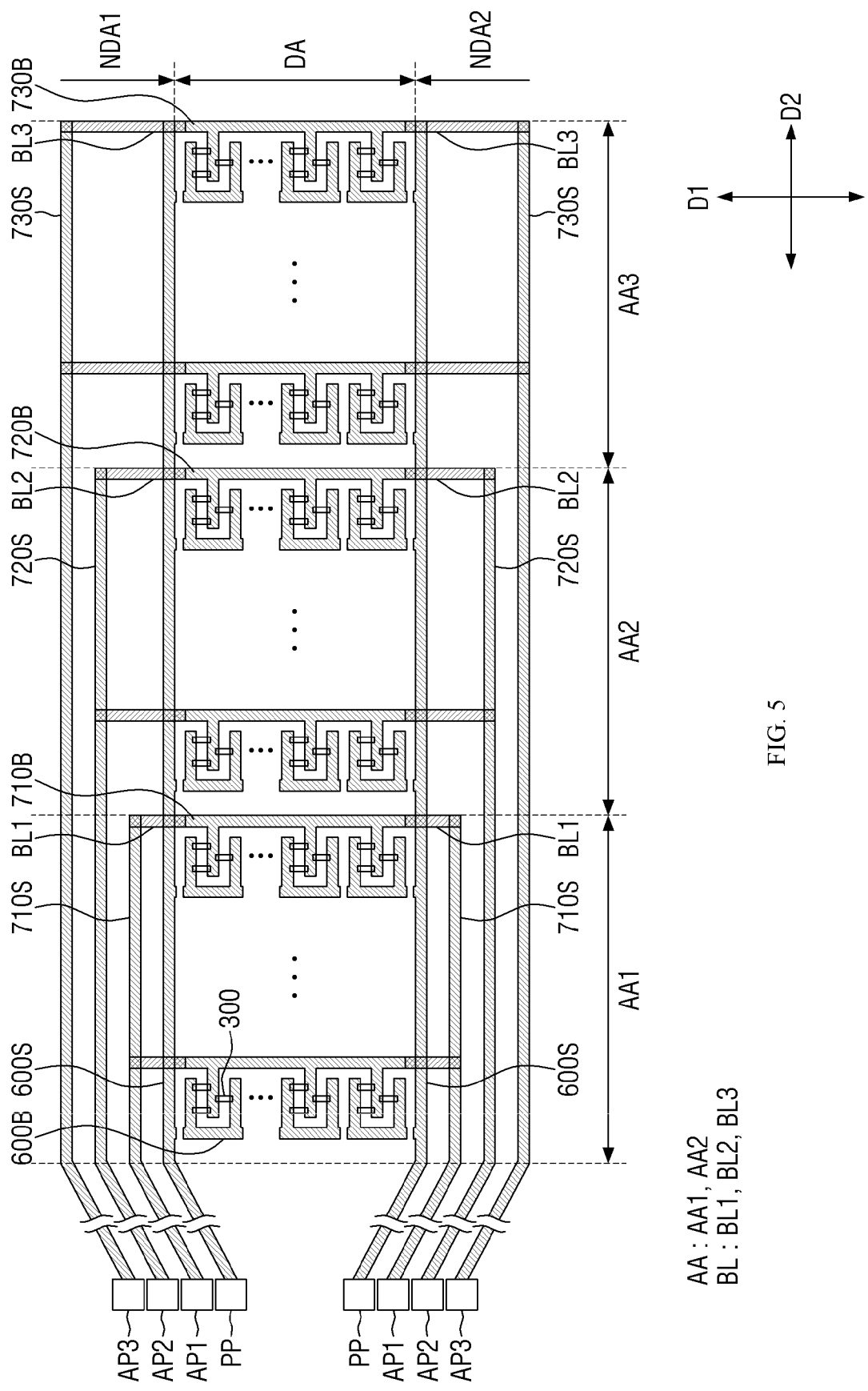
FIG. 5 is a schematic plan view of the display panel according to the embodiment.

FIG. 5 is a schematic a plan view of the display panel according to the embodiment. FIG. 5 partially illustrates the display area DA and the non-display area NDA of the display panel 10 of FIG. 4 and schematically illustrates the arrangement structure of the ground wiring 600 and the alignment wiring 700. In addition, FIG. 5 illustrates the display panel 10 of FIG. 4 rotated 90 degrees. Accordingly, it can be understood that the first direction D1 of FIG. 5 is the vertical direction in a plan view, and the second direction D2 is the horizontal direction in a plan view.

In FIG. 5, only the ground wiring 600, the alignment wiring 700 and the light emitting elements 300 are illustrated, for example, the structures of only some of the members in the display panel 10 are illustrated in more detail. The arrangement of the ground wiring 600 and the alignment wiring 700 will now be described in more detail.

Referring to FIG. 5, the display panel 10 may include the display area DA extending in the second direction D2 (the horizontal direction in a plan view), a first non-display area NDA1 located above the display area DA in a plan view and a second non-display area NDA2 located below the display area DA in a plan view. The first non-display area NDA1 and the second non-display area NDA2 can be understood as the non-display area NDA located on the left side and the right side in FIG. 4, respectively.

In addition, the display panel 10 may include a plurality of alignment areas AA extending in the first direction D1 and arranged in the second direction D2. In FIG. 5, a first alignment area AA1, a second alignment area AA2 and a third alignment area AA3 may be defined from the left side of the display panel 10 in a plan view, for example, from a side where the pads PP and AP are located toward the other side in the second direction D2.

A direction in which the pads PP and AP are located with respect to the center of each alignment area AA will hereinafter be defined as a 'first side' of each alignment area AA, and the opposite direction will be defined as a 'second side.' For example, in FIG. 5, the pads PP and AP may be on the first side of the first alignment area AA1, and the second alignment area AA2 may be on the second side of the first alignment area AA1. In addition, the first alignment area AA1 may be on the first side of the second alignment area AA2, and the third alignment area AA3 may be on the second side of the second alignment area AA2.

The alignment areas AA are not the areas distinguished by set or predetermined members at the boundaries between them, but are the areas distinguished by the alignment wiring stem portions 710S through 730S having different lengths. Each alignment area AA may overlap the display area DA and the non-display area NDA of the display panel 10. As illustrated in FIG. 5, each alignment area AA of the display panel 10 in a plan view may overlap the display area DA and extend in the first direction D1 to overlap the non-display area NDA.

In FIG. 5, the display panel 10 includes three different alignment wirings 710 through 730 to define three alignment areas AA1 through AA3 as an exemplary embodiment. However, the present disclosure is not limited to this case, and it should be apparent to those of ordinary skill in the art that more alignment areas AA can be defined. For example, when the alignment wirings 710 through 730 include a larger number of wirings having different lengths, a larger number of alignment areas AA can be defined.

In addition, in FIG. 5, the alignment areas AA extend in the first direction D1 to have a linear shape and are arranged with each other. In another example, each alignment area AA may be divided in the first direction D1, and thus a plurality of alignment areas AA may also be arranged in the first direction D1. For example, the alignment areas AA may be defined in a substantially lattice shape. This will be described in more detail in another embodiment.

One ground wiring stem portion 600S may be in each of the first non-display area NDA1 and the second non-display area NDA2 to form one pair. A side of each of the ground wiring stem portions 600S is coupled to a power pad PP, and the other side extends in the second direction D2. The other side of each of the ground wiring stem portions 600S may extend up to the third alignment area AA3. For example, each of the ground wiring stem portions 600S may be over all alignment areas AA1 through AA3 of the display panel 10. The ground wiring stem portion 600S in the first non-display area NDA1 can be understood as a first sub-ground wiring stem portion, and the ground wiring stem portion 600S in the second non-display area NDA2 can be understood as a second sub-ground wiring stem portion.

The ground wiring branch portions 600B may branch from the ground wiring stem portions 600S toward the display area DA and extend in the first direction D1. The ground wiring branch portions 600B may be in each of the alignment areas AA1 through AA3 without distinction. For example, the ground wiring branch portions 600B may be arranged at set or predetermined intervals in the first alignment area AA1, the second alignment area AA2, and the third alignment area AA3.

Each of the first through third alignment wiring stem portions 710S through 730S is in each of the first non-display area NDA1 and the second non-display area NDA2 to form one pair. For example, three pairs of alignment wiring stem portions 710S through 730S are in the display panel 10 of FIG. 5. The alignment wiring stem portions 710S through 730S are spaced apart from each other and are also spaced apart from the ground wiring stem portions 600S. The first alignment wiring stem portion 710S, the second alignment wiring stem portion 720S and the third alignment wiring stem portion 730S in the first non-display area NDA1 can be understood as a first sub-alignment wiring stem portion, a third sub-alignment wiring stem portion and a fifth sub-alignment wiring stem portion, respectively, and the first alignment wiring stem portion 710S, the second alignment wiring stem portion 720S and the third alignment wiring stem portion 730S in the second non-display area NDA2 can be understood as a second sub-alignment wiring stem portion, a fourth sub-alignment wiring stem portion and a sixth sub-alignment wiring stem portion, respectively. The ground wiring stem portions 600S and the alignment wiring stem portions 710S through 730S will be described below without being referred to as sub-wiring stem portions.

In the drawing, the ground wiring stem portion 600S is in each of the first non-display area NDA1 and the second non-display area NDA2 on a side adjacent to the display area DA, and the first alignment wiring stem portion 710S, the second alignment wiring stem portion 720S and the third alignment wiring stem portion 730S are located toward the opposite side. As described above, the present disclosure is not limited to this case, and the arrangement of the above members and the gaps between them can vary.

The alignment wiring stem portions 710S through 730S may extend toward a side of the display panel 10 and may be coupled to different signal application pads AP1 through AP3. The first alignment wiring stem portions 710S are coupled to the first signal application pads AP1, the second alignment wiring stem portions 720S are coupled to the second signal application pads AP2, and the third alignment wiring stem portions 730S are coupled to the third signal applications pad AP3. The signal application pads AP1 through AP3 may be driven separately to apply different signals to the alignment wiring stem portions 710S through 730S, respectively.

In addition, the alignment wiring stem portions 710S through 730S may extend from the first side of the first alignment area AA1 toward the second side of the third alignment area AA3 in the second direction D2 and may have different lengths.

Each of the third alignment wiring stem portions 730S has a side coupled to a third signal application pad AP3 and the other side extending from the first alignment area AA1 in the second direction D2. The other side of each of the third alignment wiring stem portions 730S may extend up to the second alignment area AA2 and the third alignment area AA3. For example, each of the third alignment wiring stem portions 730S may be over the first alignment area AA1, the second alignment area AA2, and the third alignment area AA3.

The first alignment wiring stem portions 710S and the second alignment wiring stem portions 720S may have their respective sides coupled to the first signal application pads AP1 and the second signal application pads AP2, respectively, and the other sides extending from the first alignment area AA1 in the second direction D2. On the other hand, the other side of each of the first alignment wiring stem portions 710S may extend up to the first alignment area AA1, and the other side of each of the second alignment wiring stem portions 720S may extend up to the second alignment area AA2. For example, each of the first alignment wiring stem portions 710S may be in the first alignment area AA1, and each of the second alignment wiring stem portions 720S may be over the first alignment area AA1 and the second alignment area AA2.

The third alignment wiring branch portions 730B branch from the third alignment wiring stem portions 730S, which overlap the third alignment area AA3, toward the display area DA. For example, the third alignment wiring branch portions 730B may be only in the third alignment area AA3 without being in the first alignment area AA1 and the second alignment area AA2 and may be spaced apart from the ground wiring branch portions 600B in the third alignment area AA3 to face the ground wiring branch portions 600B.

The first alignment wiring branch portions 710B branch from the first alignment wiring stem portions 710S, which overlap the first alignment area AA1, toward the display area DA. The second alignment wiring branch portions 720B branch from the second alignment wiring stem portions 720S, which overlap the second alignment area AA2, toward the display area DA. For example, the first alignment wiring branch portions 710B may be only in the first alignment area AA1 without being in the second alignment area AA2 and the third alignment area AA3 and may be spaced apart from the ground wiring branch portions 600B in the first alignment area AA1 to face the ground wiring branch portions 600B. In addition, the second alignment wiring branch portions 720B may be only in the second alignment area AA2 without being in the first alignment area AA1 and the third alignment area AA3 and may be spaced apart from the ground wiring branch portions 600B in the second alignment area AA2 to face the ground wiring branch portions 600B.

The path of the first alignment wiring branch portions 710B, the second alignment wiring branch portions 720B or the third alignment wiring branch portions 730B branching from each of the alignment wiring stem portions 710S through 730S may be blocked by another alignment wiring stem portion 710S, 720S or 730S or by the ground wiring stem portion 600S. In this case, various suitable paths for the wirings may be formed in the same layer in order to secure the paths of the alignment wiring branch portions 710B through 730B. However, this may complicate the arrangement of the wirings and cause crosstalk.

Therefore, the alignment wirings 710 through 730 may further include bridge wirings BL electrically coupling the alignment wiring stem portions 710S through 730S in the non-display area NDA1 and NDA2 to the alignment wiring branch portions 710B through 730B in the display area DA.

In an example, the first alignment wiring stem portions 710S may be electrically coupled to the first alignment wiring branch portions 710B by first bridge wirings BL1 in the first alignment area AA1. The first bridge wirings BL1 may partially overlap the ground wiring stem portions 600S. The second alignment wiring stem portions 720S may be electrically coupled to the second alignment wiring branch portions 720B by second bridge wirings BL2 in the second alignment area AA2. The second bridge wirings BL2 may partially overlap the ground wiring stem portions 600S. The third alignment wiring stem portions 730S may be electrically coupled to the third alignment wiring branch portions 730B by third bridge wirings BL3 in the third alignment area AA3. The third bridge wirings BL3 may partially overlap the ground wiring stem portions 600S.

In addition, although not illustrated in the drawing, the alignment wiring stem portions 710S through 730S, the alignment wiring branch portions 710B through 730B, and the bridge wirings BL may be in different wiring layers. The alignment wiring stem portions 710S through 730S and the alignment wiring branch portions 710B through 730B may be in a first wiring layer, and the bridge wirings BL may be in a second wiring layer different from the first wiring layer. The bridge wirings BL in the second wiring layer may be coupled to the alignment wiring stem portions 710S through 730S and the alignment wiring branch portions 710B through 730B through set or predetermined contact holes.

However, the present disclosure is not limited to this case. As described above, the arrangement structure of the ground wiring stem portions 600S and the alignment wiring stem portions 710S through 730S in the non-display area NDA can vary. Accordingly, other bridge wirings BL may be further included.

In summary, the ground wiring branch portions 600B may be over the entire area of the display panel 10. The ground wiring branch portions 600B may be provided regardless of the alignment areas AA defined by the alignment wiring stem portions 710S through 730S. On the other hand, each of the alignment wiring branch portions 710B through 730B may be in any one of the alignment areas AA defined by the alignment wiring stem portions 710S through 730S. When each of the alignment wiring stem portions 710S through 730S extending from a side coupled to a signal application pad AP toward the other side ends in an area, the alignment wiring branch portions 710B, 720B or 730B may be only in the alignment area AA where the other side of each of the alignment wiring stem portions 710S through 730S ends.

For example, the ground wiring branch portions 600B are placed to face the first alignment wiring branch portions 7106 in the first alignment area AA1. In addition, the ground wiring branch portions 600B may be placed to face the second alignment wiring branch portions 720B in the second alignment area AA2 and to face the third alignment wiring branch portions 730B in the third alignment area AA3. As described above, the ground wiring branch portions 600B and the alignment wiring branch portions 710B through 730B may include branches extending in the second direction D2, and the light emitting elements 300 may be between the branches.

As described above, a coating solution S (see FIG. 10) in which the light emitting elements 300 are dispersed is coated on the ground wiring 600 and the alignment wirings 710 through 730 when the display panel 10 is manufactured. Alignment signals are applied to the ground wiring 600 and the alignment wirings 710 through 730, and a capacitance C (see FIG. 10) is formed by an electric field. The electric field-induced capacitance C may apply a dielectrophoretic force to the light emitting elements 300 in the coating solution S, thereby aligning the light emitting elements 300 between the wirings.

Here, the alignment wiring branch portions 710B through 730B and the ground wiring branch portions 600B may act as wiring resistance. The voltage of an alignment signal applied from each of the signal application pads AP1 through AP3 coupled to the respective sides of the alignment wirings 710 through 730 may decrease toward the other side of the display panel 10 (e.g., toward the third alignment area AA3) due to the resistance.

However, the display panel 10 according to the embodiment may apply an alignment signal through a different alignment wiring 710, 720 or 730 according to an alignment area AA and remove unnecessary alignment wiring branch portions 7106 through 730B from the alignment wirings 710 through 730, thereby minimizing or reducing the resistance value.

For example, when the light emitting elements 300 are aligned in the second alignment area AA2, the ground wiring 600 may be grounded, and an alignment signal may be applied through the second alignment wiring 720. The second alignment wiring 720 includes the second alignment wiring stem portions 720S extending from a side of the display panel 10 to the second alignment area AA2 and the second alignment wiring branch portions 720B only in the second alignment area AA2. The second signal application pads AP2 coupled to respective sides of the second alignment wiring stem portions 720S may apply an alignment signal for aligning the light emitting elements 300 and may form an electric field-induced capacitance only in the second alignment area AA2 through the second alignment wiring branch portions 720B. Because the second alignment wiring branch portions 720B are not in the first alignment area AA1 and the third alignment area AA3, the alignment signal is not applied to the first alignment area AA1 and the third alignment area AA3. For example, when the light emitting elements 300 are aligned in the second alignment area AA2, an unnecessary capacitance C is not formed in the first alignment area AA1 and the third alignment area AA3, and the voltage drop of the alignment signal transmitted from the second signal application pads AP2 may be minimized or reduced. In some embodiments, a voltage of a sufficient intensity can be applied even to an area located far from the signal application pads AP.

The light emitting elements 300 have respective ends coupled to the ground wiring branch portions 600B and the other respective ends coupled to the first alignment wiring branch portions 710B in the first alignment area AA1. On the other hand, the light emitting elements 300 may have respective ends coupled to the ground wiring branch portions 600B and the other respective ends coupled to the second alignment wiring branch portions 720B in the second alignment area AA2 and may have respective ends coupled to the ground wiring branch portions 600B and the other respective ends coupled to the third alignment wiring branch portions 730B in the third alignment area AA3.

Accordingly, when the display panel 10 according to the embodiment is manufactured, the voltage drop of an alignment signal transmitted through a signal application pad AP can be minimized or reduced, and a voltage of an intensity sufficient to align the light emitting elements 300 in the entire area of the display panel 10 can be applied. In addition, the maximum current value used to align the light emitting elements 300 can be reduced even when the large-area display panel 10 is manufactured.

Figure 6:
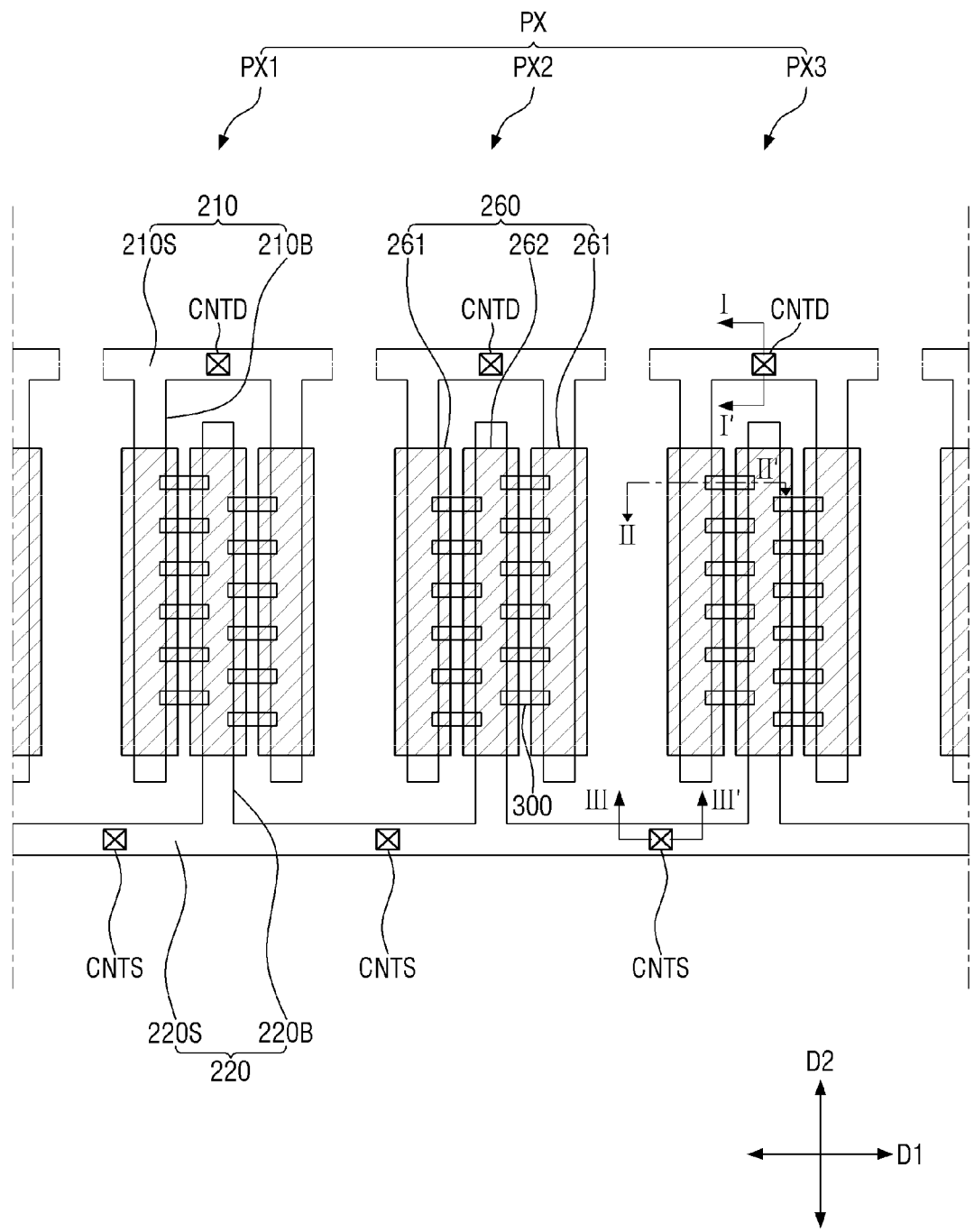
FIG. 6 is a schematic enlarged view of portion A of FIG. 4.

FIG. 6 is a schematic enlarged view of portion A of FIG. 4.

Referring to FIG. 6, the display panel 10 may include a plurality of electrodes 210 and 220 and a plurality of light emitting elements 300. At least a part of each of the electrodes 210 and 220 may be in each pixel PX and electrically coupled to the light emitting elements 300 and may apply an electrical signal so that the light emitting elements 300 emit light of a set or specific color.

In addition, at least a part of each of the electrodes 210 and 220 may be utilized to form an electric field in each pixel PX in order to align the light emitting elements 300. For example, when light emitting elements 300 that emit light of different colors are aligned in a plurality of pixels PX, it is necessary to accurately align the different light emitting elements 300 in the pixels PX, respectively. When the light emitting elements 300 are aligned using dielectrophoresis, the display panel 10 may be coated with a solution containing the light emitting elements 300, and AC power may be applied to the display panel 10 to form an electric field-induced capacitance. Accordingly, a dielectrophoretic force may be applied to the light emitting elements 300, thereby aligning the light emitting elements 300.

The electrodes 210 and 220 may include a first electrode 210 and a second electrode 220. In an exemplary embodiment, the first electrode 210 may be a separate pixel electrode in each pixel PX, and the second electrode 220 may be a common electrode formed over a plurality of pixels PX. Any one of the first electrode 210 and the second electrode 220 may be an anode of each light emitting element 300, and the other may be a cathode of each light emitting element 300. However, the present disclosure is not limited to this case, and the opposite may also be true.

Each of the first electrode 210 and the second electrode 220 may include an electrode stem portion 210S or 220S extending in the first direction D1 and at least one electrode branch portion 2106 or 220B extending and branching from the electrode stem portion 210S or 220S in the second direction D2 intersecting the first direction D1.

In some embodiments, the first electrode 210 may include a first electrode stem portion 210S extending in the first direction D1 and at least one first electrode branch portion 210B branching from the first electrode stem portion 210S and extending in the second direction D2. Although not illustrated in the drawing, the first electrode stem portion 210S may have an end coupled to a signal application pad PAD (see FIG. 4) and the other end extending in the first direction D1 and electrically isolated between the pixels PX. The signal application pad may be coupled to the display panel 10 or an external power source so as to apply an electrical signal to the first electrode stem portion 210S or to supply AC power when the light emitting elements 300 are aligned.

Any one of the electrode stem portions 210S and 220S of the electrodes 210 and 220 may extend toward and be coupled to the alignment wiring stem portions 700S of FIGS. 4 and 5, and the other one may extend toward the ground wiring stem portions 600S but may end at a position spaced apart from the ground wiring stem portions 600S. Although not illustrated in FIG. 6, in the first direction D1 in which the electrode stem portions 210S and 220S extend, the ground wiring stem portions 600S and the alignment wiring stem portions 700S may be arranged to extend in the second direction D2. For example, the electrode stem portions 210S and 220S illustrated in FIG. 6 may be the ground wiring branch portions 600B and any one of the alignment wiring branch portions 700B illustrated in FIG. 5.

In an example, the first electrode stem portion 210S may extend toward the ground wiring stem portions 600S but may end at a position spaced apart from the ground wiring stem portions 600S, and a second electrode stem portion 220S may extend toward each alignment wiring stem portion 700S and may be coupled to each alignment wiring stem portion 700S. In this case, the first electrode stem portion 210S may be a part of a ground wiring branch portion 600B, and the second electrode branch portion 220S may be any one of the alignment wiring branch portions 700B. However, the present disclosure is not limited to this case.

The first electrode stem portion 210S of one pixel may lie on substantially the same straight line as the first electrode stem portion 210S of a neighboring pixel (e.g., adjacent in the first direction D1) belonging to the same row. In other words, both ends of the first electrode stem portion 210S of one pixel may end between pixels PX, but the first electrode stem portion 210S of a neighboring pixel may be aligned on an extension of the first electrode stem portion 210S of the one pixel. This arrangement of the first electrode stem portions 210S may be achieved by forming one stem electrode in a manufacturing process and then cutting the stem electrode using a laser or the like after the alignment process of the light emitting elements 300. Accordingly, the first electrode stem portions 210S respectively in the pixels PX may apply different electrical signals to their respective first electrode branch portions 210B, and the first electrode branch portions 210B may be driven separately.

The first electrode branch portion 210B may branch from at least a part of the first electrode stem portion 210S and extend in the second direction D2 to end at a position spaced apart from the second electrode stem portion 220S facing the first electrode stem portion 210S. For example, the first electrode branch portion 210B in each pixel PX may have an end coupled to the first electrode stem portion 210S and the other end spaced apart from the second electrode branch portion 220S. Because the first electrode branch portion 210B is coupled to the first electrode stem portion 210S which is electrically isolated in each pixel PX, a different electrical signal may be applied to the first electrode branch portion 210B of each pixel PX.

In addition, one or more first electrode branch portions 210B may be in each pixel PX. In FIG. 6, two first electrode branch portions 210B are provided, and a second electrode branch portion 220B is between the first electrode branch portions 210B. However, the present disclosure is not limited to this case, and more first electrode branch portions 210B can be provided. In this case, the first electrode branch portions 210B may be alternately arranged with a plurality of second electrode branch portions 220B and spaced apart from the second electrode branch portions 220B, and a plurality of light emitting elements 300 may be between the first and second electrode branch portions 210B and 220B. In some embodiments, the second electrode branch portion 220B may be between the first electrode branch portions 210B. Therefore, each pixel PX may have a symmetrical structure with respect to the second electrode branch portion 220B. However, the present disclosure is not limited to this case.

The second electrode 220 may include the second electrode stem portion 220S extending in the first direction D1 and spaced apart from the first electrode stem portion 210S to face the first electrode stem portion 210S and at least one second electrode branch portion 220B branching from the second electrode stem portion 220S, extending in the second direction D2 and spaced apart from the first electrode branch portions 210B to face the first electrode branch portions 210B. Like the first electrode stem portion 210S, the second electrode stem portion 220S may have an end coupled to a pad (not illustrated). However, the other end of the second electrode stem portion 220S may extend to a plurality pixels PX adjacent in the first direction D1. For example, the second electrode stem portion 220S may be electrically coupled between the pixels PX. Accordingly, both ends of the second electrode stem portion 220S in one pixel may be coupled to respective ends of the second electrode stem portions 220S of neighboring pixels between the pixels PX. Thus, the same electrical signal may be applied to the pixels PX.

The second electrode branch portion 220B may branch from at least a part of the second electrode stem portion 220S and extend in the second direction D2 to end at a position spaced apart from the first electrode stem portion 210S. For example, the second electrode branch portion 220B in each pixel PX may have an end coupled to the second electrode stem portion 220S and the other end spaced apart from the first electrode stem portion 210S. Because the second electrode branch portion 220B is coupled to the second electrode stem portion 220S which is electrically coupled between the pixels PX, the same electrical signal may be applied to the pixels PX.

In addition, the second electrode branch portion 220B may be spaced apart from the first electrode branch portions 210B to face the first electrode branch portions 210B. Here, because the first electrode stem portion 210S and the second electrode stem portion 220S are spaced apart to face each other in opposite directions with respect to the center of each pixel PX, the first electrode branch portions 210B and the second electrode branch portion 220B may extend in opposite directions. In other words, the first electrode branch portions 210B may extend in one direction of the second direction D2, and the second electrode branch portion 220B may extend in the other direction of the second direction D2, thus, respective ends of the branch portions may be in opposite directions with respect to the center of each pixel PX. However, the present disclosure is not limited to this case, and the first electrode stem portion 210S and the second electrode stem portion 220S may also be in the same (e.g., substantially the same) direction with respect to the center of each pixel PX and spaced apart from each other. In this case, the first electrode branch portions 210B and the second electrode branch portion 220B respectively branching from the electrode stem portions 210S and 220S may extend in the same (e.g., substantially the same) direction.

Although one second electrode branch portion 220B is in each pixel PX of FIG. 6, the present disclosure is not limited to this case. More second electrode branch portions 220B can also be provided.

The light emitting elements 300 may be aligned between the first electrode branch portions 210B and the second electrode branch portion 220B. For example, at least some of the light emitting elements 300 may have respective ends electrically coupled to the first electrode branch portions 210B and the other respective ends electrically coupled to the second electrode branch portion 220B.

The light emitting elements 300 may be spaced apart from each other in the second direction D2 and may be aligned substantially parallel to each other. The gap between the light emitting elements 300 is not particularly limited. In some cases, a plurality of light emitting elements 300 may be adjacent to each other while other light emitting elements 300 are spaced apart from each other by a set or predetermined gap. Alternatively, the light emitting elements 300 may be oriented and aligned in one direction with a non-uniform density.

Contact electrodes 260 may be on the first and second electrode branch portions 210B and 220B, respectively.

The contact electrodes 260 may extend in the second direction D2 and spaced apart from each other in the first direction D1. Each of the contact electrodes 260 may contact at least one end of each light emitting element 300 and may contact the first electrode 210 or the second electrode 220 to receive an electrical signal. Accordingly, the contact electrodes 260 may transmit electrical signals received from the first electrode 210 and the second electrode 220 to the light emitting elements 300.

The contact electrodes 260 may be on the electrode branch portions 210B and 220B to partially cover the electrode branch portions 2106 and 220B, respectively. The contact electrodes 260 may include first contact electrodes 261 and a second contact electrode 262 which contact an end or the other end of each light emitting element 300.

The first contact electrodes 261 may be on the first electrode branch portions 2106 and may contact an end of each light emitting element 300 which is electrically coupled to the first electrode 210. The second contact electrode 262 may be on the second electrode branch portion 220B and may contact the other end of each light emitting element 300 which is electrically coupled to the second electrode 220.

In some embodiments, both ends of each light emitting element 300 which are electrically coupled to the first electrode branch portions 2106 or the second electrode branch portion 220B may be p-type or n-type doped conductive semiconductor layers. When respective ends of the light emitting elements 300 which are electrically coupled to the first electrode branch portions 210B are p-type doped conductive semiconductor layers, the other respective ends of the light emitting elements 300 which are electrically coupled to the second electrode branch portion 220B may be n-type doped conductive semiconductor layers. However, the present disclosure is not limited to this case, and the opposite may also be true.

The first contact electrodes 261 and the second contact electrode 262 may be on the first electrode branch portions 210B and the second electrode branch portion 220B to partially cover the first electrode branch portions 2106 and the second electrode branch portion 220B, respectively. As illustrated in FIG. 1, the first contact electrodes 261 and the second contact electrode 262 may extend in the second direction D2 and may be spaced apart to face each other. Here, respective ends of the first contact electrodes 261 and the second contact electrode 262 may end at a position partially exposing respective ends of the electrode branch portions 2106 and 220B. In addition, the other respective ends of the first contact electrodes 261 and the second contact electrode 262 may end at a position spaced apart from the electrode stem portions 210S and 220S in order not to overlap the electrode stem portions 210S and 220S. However, the present disclosure is not limited to this case, and the first and second contact electrodes 261 and 262 may also completely cover the electrode branch portions 210B and 220B.

As illustrated in FIG. 6, the first electrode stem portion 210S and the second electrode stem portion 220S may be electrically coupled to a thin-film transistor 120 and a power wiring 161, which will be further described herein below, via contact holes, for example, a first electrode contact hole CNTD and a second electrode contact hole CNTS, respectively. Although the contact holes on the first electrode stem portion 210S and the second electrode stem portion 220S are in each subpixel PX in FIG. 6, the present disclosure is not limited to this case. Because the second electrode stem portion 220S extends to and electrically coupled to adjacent subpixels PX as described above, it can be electrically coupled to thin-film transistors via one contact hole in some embodiments.

The more specific structure of the members in the display panel 10 will now be described with reference to FIG. 7.

Figure 7:
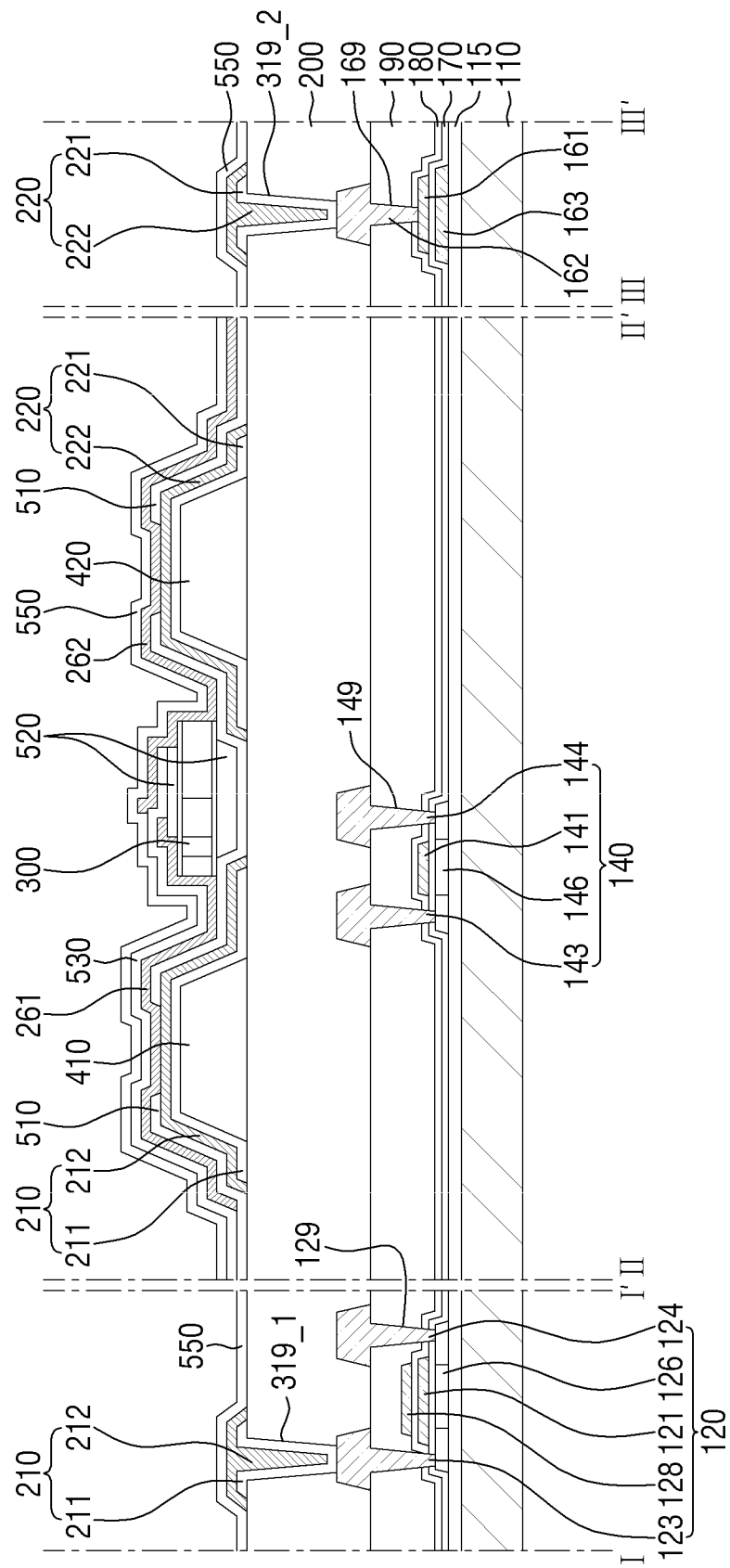
FIG. 7 is a cross-sectional view taken along lines I-I', II-II' and III-III' of FIG. 6.

FIG. 7 is a cross-sectional view taken along lines I-I', II-II' and III-III' of FIG. 6. Although only one subpixel PX is illustrated in FIG. 7, the same can be applied to other pixels. FIG. 7 illustrates a cross section across one end and the other end of a light emitting element 300.

Referring to FIGS. 6 and 7, the display panel 10 may include a substrate 110, thin-film transistors 120 and 140 on the substrate 110, and electrodes 210 and 220 and a light emitting element 300 above the thin-film transistors 120 and 140. The thin-film transistors may include a first thin-film transistor 120 and a second thin-film transistor 140 which may be a driving transistor and a switching transistor, respectively. Each of the thin-film transistors 120 and 140 may include an active layer, a gate electrode, a source electrode and a drain electrode. A first electrode 210 may be electrically coupled to the drain electrode of the first thin-film transistor 120.

In some embodiments, the substrate 110 may be an insulating substrate. The substrate 110 may be made of an insulating material such as glass, quartz, or polymer resin. The polymer material may be, for example, polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination of these materials. The substrate 110 may be a rigid substrate or a flexible substrate that can be bent, folded, or rolled.

A buffer layer 115 may be on the substrate 110. The buffer layer 115 may prevent or reduce diffusion of impurity ions, prevent or reduce penetration of moisture and/or outside air, and perform a surface planarization function. The buffer layer 115 may include silicon nitride, silicon oxide, and/or silicon oxynitride.

A semiconductor layer is on the buffer layer 115. The semiconductor layer may include a first active layer 126 of the first thin-film transistor 120, a second active layer 146 of the second thin-film transistor 140, and an auxiliary layer 163. The semiconductor layer may include polycrystalline silicon, monocrystalline silicon, or an oxide semiconductor.

A first gate insulating layer 170 is on the semiconductor layer. The first gate insulating layer 170 covers the semiconductor layer. The first gate insulating layer 170 may function as a gate insulating film of thin-film transistors. The first gate insulating layer 170 may include silicon oxide, silicon nitride, silicon oxynitride, aluminum oxide, tantalum oxide, hafnium oxide, zirconium oxide, titanium oxide, etc. These materials may be used alone or in combination with each other.

A first conductive layer is on the first gate insulating layer 170. The first conductive layer may include a first gate electrode 121 on the first active layer 126 of the first thin-film transistor 120 with the first gate insulating layer 170 interposed between them, a second gate electrode 141 on the second active layer 146 of the second thin-film transistor 140 with the first gate insulating layer 170 interposed between them, and a power wiring 161 on the auxiliary layer 163 with the first gate insulating layer 170 interposed between them. The first conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer may be a single film or a multilayer film.

A second gate insulating layer 180 is on the first conductive layer. The second gate insulating layer 180 may be an interlayer insulating film. The second gate insulating layer 180 may be made of an inorganic insulating material such as silicon oxide, silicon nitride, silicon oxynitride, hafnium oxide, aluminum oxide, titanium oxide, tantalum oxide, or zinc oxide.

A second conductive layer is on the second gate insulating layer 180. The second conductive layer includes a capacitor electrode 128 on the first gate electrode 121 with the second insulating layer interposed between them. The capacitor electrode 128 may form a storage capacitor with the first gate electrode 121.

Like the first conductive layer, the second conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

An interlayer insulating layer 190 is on the second conductive layer. The interlayer insulating layer 190 may be an interlayer insulating film. Further, the interlayer insulating layer 190 may perform a surface planarization function. The interlayer insulating layer 190 may include an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB).

A third conductive layer is on the interlayer insulating layer 190. The third conductive layer includes a first drain electrode 123 and a first source electrode 124 of the first thin-film transistor 120, a second drain electrode 143 and a second source electrode 144 of the second thin-film transistor 140, and a power electrode 162 on the power wiring 161.

The first source electrode 124 and the first drain electrode 123 may respectively be electrically coupled to the first active layer 126 via first contact holes 129 penetrating the interlayer insulating layer 190 and the second gate insulating layer 180. The second source electrode 144 and the second drain electrode 143 may respectively be electrically coupled to the second active layer 146 via second contact holes 149 penetrating the interlayer insulating layer 190 and the second gate insulating layer 180. The power electrode 162 may be electrically coupled to the power wiring 161 via a third contact hole 169 penetrating the interlayer insulating layer 190 and the second gate insulating layer 180.

The third conductive layer may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer may be a single film or a multilayer film. For example, the third conductive layer may have a stacked structure of Ti/Al/Ti, Mo/Al/Mo, Mo/AlGe/Mo, or Ti/Cu.

An insulating substrate layer 200 is on the third conductive layer. The insulating substrate layer 200 may be made of an organic material such as polyacrylates resin, epoxy resin, phenolic resin, polyamides resin, polyimides resin, unsaturated polyesters resin, polyphenylenethers resin, polyphenylenesulfides resin or benzocyclobutene (BCB). The surface of the insulating substrate layer 200 may be flat.

A plurality of banks 410 and 420 may be on the insulating substrate layer 200. The banks 410 and 420 may be spaced apart to face each other in each pixel PX, and a first electrode 210 and a second electrode 220 may respectively be on the banks 410 and 420 spaced apart from each other, for example, a first bank 410 and a second bank 420. In FIG. 6, three banks 410 and 420, for example, two first banks 410 and one second bank 420 are in one pixel PX, and the first electrode 210 and the second electrode 220 cover the first banks 410 and the second bank 420, respectively. In FIG. 7, a cross section of one of the first banks 410 and one second bank 420 is illustrated, and the arrangement structure of the first bank 410 and the second bank 420 may be applicable to the other first bank 410 not illustrated in FIG. 7.

However, the number of banks 410 and 420 is not limited. For example, more banks 410 and 420 may be placed in one pixel PX, and thus more first electrodes 210 and more second electrodes 220 may be placed. The banks 410 and 420 may include one or more first banks 410 on which the first electrodes 210 are provided and one or more second banks 420 on which the second electrodes 220 are provided. In this case, the first banks 410 and the second banks 420 may be spaced apart to face each other and may be alternately arranged in one direction. In some embodiments, two first banks 410 may be spaced apart from each other, and one second bank 420 may be between the first banks 410 spaced apart from each other.

In addition, although not illustrated in FIG. 7, each of the first electrode 210 and the second electrode 220 may include the electrode stem portion 210S or 220S and the electrode branch portion 210B or 220B as described above. It can be understood that the first electrode branch portion 2106 and the second electrode branch portion 220B are on the first bank 410 and the second bank 420 of FIG. 7, respectively.

The banks 410 and 420 may be formed of substantially the same material in one process. In this case, the banks 410 and 420 may form one lattice pattern. The banks 410 and 420 may include polyimide (PI).

Although not illustrated in the drawing, at least some of the banks 410 and 420 may be at the boundary of each pixel PX to separate the pixels PX from each other. In this case, the electrodes 210 and 220 may not be on the banks 410 and 420 at the boundaries of the pixels PX. These banks may also be arranged in a substantially lattice pattern, together with the first and second banks 410 and 420 described above. At least some of the banks 410 and 420 at the boundary of each subpixel PX may also cover other electrode lines of the display panel 10.

At least a portion of each of the banks 410 and 420 may protrude from the insulating substrate layer 200. Each of the banks 410 and 420 may protrude upward from a plane in which the light emitting element 300 is provided, and at least a part of the protruding portion may slope. Reflective layers 211 and 221 on the protruding and sloping banks 410 and 420 may reflect incident light. Light directed from the light emitting element 300 to the reflective layers 211 and 221 may be reflected to the outside of the display panel 10, for example, to above the banks 410 and 420. The shape of the protruding banks 410 and 420 is not particularly limited. In FIG. 7, each of the banks 410 and 420 has inclined side surfaces, a flat upper surface, and angled corners. However, the present disclosure is not limited to this case, and each of the banks 410 and 420 may also protrude in a curved shape.

The reflective layers 211 and 221 may be on the banks 410 and 420.

A first reflective layer 211 covers the first bank 410 and has a portion electrically coupled to the first drain electrode 123 of the first thin-film transistor 120 via a fourth contact hole 319_1 penetrating the insulating substrate layer 200. A second reflective layer 221 covers the second bank 420 and has a portion electrically coupled to the power electrode 162 via a fifth contact hole 319_2 penetrating the insulating substrate layer 200.

The first reflective layer 211 may be electrically coupled to the first drain electrode 123 of the first thin-film transistor 120 via the fourth contact hole 319_1 in each pixel PX. Therefore, the first thin-film transistor 120 may be in an area overlapping each pixel PX. In FIG. 6, the first reflective layer 211 is electrically coupled to the first thin-film transistor 120 via the first electrode contact hole CNTD on the first electrode stem portion 210S. For example, the first electrode contact hole CNTD may be the fourth contact hole 319_1.

The second reflective layer 221 may be electrically coupled to the power electrode 162 via the fifth contact hole 319_2 in each pixel PX. In FIG. 7, the second reflective layer 221 is coupled to the power electrode 162 via the fifth contact hole 319_2 in one pixel PX. In FIG. 6, the second electrodes 220 of the pixels PX are respectively electrically coupled to the power wirings 161 via a plurality of second electrode contact holes CNTS on the second electrode stem portion 220S. For example, each of the second electrode contact holes CNTS may be the fifth contact hole 319_2.

As described above, in FIG. 6, the first electrode contact hole CNTD and the second electrode contact hole CNTS are on the first electrode stem portion 210S and the second electrode stem portion 220S, respectively. Accordingly, in the cross section of the display panel 10 of FIG. 7, the first electrode 210 and the second electrode 220 are respectively electrically coupled to the first thin-film transistor 120 and the power wiring 161 via the fourth contact hole 319_1 and the fifth contact hole 319_2 in areas spaced apart from the banks 410 and 420 on which the first electrode branch portion 210B and the second electrode branch portion 220B are provided.

However, the present disclosure is not limited to this case. For example, in FIG. 6, the second electrode contact hole CNTS may also be at various suitable positions on the second electrode stem portion 220S and, in some cases, may be located on the second electrode branch portion 220B. In addition, in some embodiments, the second reflective layer 221 may be coupled to one second electrode contact hole CNTS or one fifth contact hole 319_2 in an area other than one pixel PX.

The display panel 10 may have an area other than the display area DA where the pixels PX are provided, for example, the non-display area NDA. The second electrodes 220 of the pixels PX may be electrically coupled to each other by the second electrode stem portion 220S to receive the same electrical signal.

In some embodiments, in the case of the second electrodes 220, the second electrode stem portion 220S may be electrically coupled to the power electrodes 162 via one contact hole in the non-display area NDA located on the periphery of the display panel 10. Even if the second electrode stem portion 220S is coupled to the power electrodes 162 via one contact hole unlike in the display panel 10 of FIG. 6, the same electrical signal may be applied to the second electrode branch portion 220B of each pixel PX because the second electrode stem portion 220S extends to adjacent pixels PX and is electrically coupled. The position of the contact hole through which the second electrodes 220 of the display panel 10 receive an electrical signal from the power electrodes 162 may vary depending on the structure of the display panel 10.

Referring again to FIGS. 6 and 7, the reflective layers 211 and 221 may include a material having high reflectivity in order to reflect light emitted from the light emitting element 300. For example, the reflective layers 211 and 221 may include a material such as, but not limited to, silver (Ag) or copper (Cu).

A first electrode layer 212 and a second electrode layer 222 may be on the first reflective layer 211 and the second reflective layer 221, respectively.

The first electrode layer 212 is directly on the first reflective layer 211. The first electrode layer 212 may have substantially the same pattern as the first reflective layer 211. The second electrode layer 222 is directly on the second reflective layer 221 and spaced apart from the first electrode layer 212. The second electrode layer 222 may have substantially the same pattern as the second reflective layer 221.

In an embodiment, the electrode layers 212 and 222 may cover the reflective layers 211 and 221, respectively. For example, the electrode layers 212 and 222 may be formed larger than the reflective layers 211 and 221 to cover side surfaces of respective ends of the reflective layers 211 and 221. However, the present disclosure is not limited to this case.

The first electrode layer 212 and the second electrode layer 222 may respectively transmit electrical signals, which are transmitted to the first reflective layer 211 and the second reflective layer 221, to contact electrodes 261 and 262 which will be further described herein below. The electrode layers 212 and 222 may include a transparent conductive material. For example, the electrode layers 212 and 222 may include a material such as, but not limited to, indium tin oxide (ITO), indium zinc oxide (IZO), or indium tin-zinc oxide (ITZO). In some embodiments, the reflective layers 211 and 221 and the electrode layers 212 and 222 may form a structure in which one or more transparent conductive layers such as ITO, IZO or ITZO and one or more metal layers such as silver or copper are stacked. For example, the reflective layers 211 and 221 and the electrode layers 212 and 222 may form a stacked structure of ITO/silver (Ag)/ITO.

The first reflective layer 211 and the first electrode layer 212 on the first bank 410 constitute the first electrode 210. The first electrode 210 may protrude from both ends of the first bank 410. Accordingly, the protruding regions of the first electrode 210 may contact the insulating substrate layer 200. In addition, the second reflective layer 221 and the second electrode layer 222 on the second bank 420 constitute the second electrode 220. The second electrode 220 may protrude from both ends of the second barrier rib 420. Accordingly, the protruding regions of the second electrode 220 may contact the insulating substrate layer 200.

The first electrode 210 and the second electrode 220 may completely cover the first bank 410 and the second bank 420, respectively. As described above, the first electrode 210 and the second electrode 220 are spaced apart to face each other. A first insulating layer 510 may be in the space between the electrodes as will be further described herein below, and the light emitting element 350 may be on the first insulating layer 510.

In addition, the first reflective layer 211 may receive a driving voltage from the first thin-film transistor 120, and the second reflective layer 221 may receive a power supply voltage from the power wiring 161. Therefore, the first electrode 210 and the second electrode 220 may receive the driving voltage and the power supply voltage, respectively. The first electrode 210 may be electrically coupled to the first thin-film transistor 120, and the second electrode 220 may be electrically coupled to the power wiring 161. Accordingly, a first contact electrode 261 and a second contact electrode 262 on the first electrode 210 and the second electrode 220 may receive the driving voltage and the power supply voltage. The driving voltage and the power supply voltage may be transmitted to the light emitting element 300, and a set or predetermined current may flow through the light emitting element 300, causing the light emitting element 300 to emit light.

The first insulating layer 510 is on the first electrode 210 and the second electrode 220 to partially cover the first electrode 210 and the second electrode 220. The first insulating layer 510 may cover most of an upper surface of each of the first electrode 210 and the second electrode 220 and expose a part of each of the first electrode 210 and the second electrode 220. In addition, the first insulating layer 510 may be in a space between the first electrode 210 and the second electrode 220. The first insulating layer 510 may have an island shape or a linear shape formed along the space between the first electrode branch portion 210B and the second electrode branch portion 220B in a plan view.

In FIG. 7, the first insulating layer 510 is between one first electrode 210 (e.g., the first electrode branch portion 210B) and one second electrode 220 (e.g., the second electrode branch portion 220B). Because the first electrode 210 and the second electrode 220 may be provided in plural numbers as described above, the first insulating layer 510 may also be between one first electrode 210 and another second electrode 220 or between one second electrode 220 and another first electrode 210. In addition, the first insulating layer 510 may partially cover side portions opposite to respective facing side portions of the first electrode 210 and the second electrode 220. For example, the first insulating layer 510 may expose a central portion of each of the first electrode 210 and the second electrode 220.

The light emitting element 300 is on the first insulating layer 510. The first insulating layer 510 may be between the light emitting element 300 and the insulating substrate layer 200. A lower surface of the first insulating layer 510 may contact the insulating substrate layer 200, and the light emitting element 300 may be on an upper surface of the first insulating layer 510. In addition, the first insulating layer 510 may contact the electrodes 210 and 220 on both sides to electrically insulate the electrodes 210 and 220 from each other.

The first insulating layer 510 may overlap some regions of the electrodes 210 and 220, for example, may partially overlap respective regions of the first electrode 210 and the second electrode 220 which protrude in directions facing each other. In addition, the first insulating layer 510 may be in regions where the inclined side surfaces and flat upper surfaces of the banks 410 and 420 overlap the electrodes 210 and 220.

For example, the first insulating layer 510 may cover respective ends of the first electrode 210 and the second electrode 220 which protrude in the directions facing each other. A part of the lower surface of the first insulating layer 510 may contact the insulating substrate layer 200, and a part of the lower surface and a side surface of the first insulating layer 510 may contact each of the electrodes 210 and 220. Accordingly, the first insulating layer 510 may protect regions overlapping the electrodes 210 and 220 and electrically insulate the regions from each other. In addition, the first insulating layer 510 prevents or reduces direct contact of a first conductivity type semiconductor 310 and a second conductivity type semiconductor 320 of the light emitting element 300 with other members, thereby preventing or reducing damage to the light emitting element 300 from being damaged.

However, the present disclosure is not limited to this case. In some embodiments, the first insulating layer 510 may be only on regions of the first electrode 210 and the second electrode 220 which overlap the inclined side surfaces of the banks 410 and 420. In this case, the lower surface of the first insulating layer 510 may end on the inclined side surfaces of the banks 410 and 420, and the electrodes 210 and 220 on part of the inclined side surfaces of the banks 410 and 420 may be exposed to contact the contact electrodes 260.

In addition, the first insulating layer 510 may expose both ends of the light emitting element 300. Accordingly, the contact electrodes 260 may contact the exposed upper surface of each of the electrodes 210 and 220 and both ends of the light emitting element 300 and may transmit electrical signals, which are applied to the first electrode 210 and the second electrode 220, to the light emitting element 300.

One or more light emitting elements 300 may be between the first electrode 210 and the second electrode 220. In FIG. 7, one light emitting element 300 is between the first electrode 210 and the second electrode 220 in cross section. However, as in FIG. 6, it should be apparent to those of ordinary skill in the art that a plurality of light emitting elements 300 are in another direction in a plan view (e.g., the second direction D2).

In some embodiments, the light emitting element 300 may have an end electrically coupled to the first electrode 210 and the other end electrically coupled to the second electrode 220. Both ends of the light emitting element 300 may contact the first contact electrode 261 and the second contact electrode 262, respectively.

Although only light emitting elements 300 that emit light of the same (e.g., substantially the same) color are in each pixel PX in FIG. 6, the present disclosure is not limited to this case. Light emitting elements 300 that emit light of different colors may also be together in one pixel PX as described above.

The light emitting element 300 may be a light emitting diode (LED). The light emitting element 300 may be a nanostructure whose size is generally in nanometers. The light emitting element 300 may be an inorganic LED made of an inorganic material. When the light emitting element 300 is an inorganic LED, if a light emitting material having an inorganic crystal structure is placed between two opposing electrodes and an electric field is formed in the light emitting material in a set or specific direction, the inorganic LED may be aligned between the two electrodes having set or specific polarities.

In some embodiments, the light emitting element 300 may include the first conductivity type semiconductor 310, an element active layer 330, the second conductivity type semiconductor 320 and an electrode material layer 370 formed sequentially and an insulating material layer 380 covering outer circumferential surfaces of the above layers. In the light emitting element 300, the first conductivity type semiconductor 310, the element active layer 330, the second conductivity type semiconductor 320 and the electrode material layer 370 may be stacked in this order in a direction parallel (e.g., substantially parallel) to the insulating substrate layer 200. In other words, the light emitting element 300 having the above layers may be in the horizontal direction parallel (e.g., substantially parallel) to the insulating substrate layer 200. However, the present disclosure is not limited to this case, and the light emitting element 300 may also be aligned between the first electrode 210 and the second electrode 220 such that the above-described stacked direction is reversed.

In addition, although only one light emitting element 300 is illustrated in FIG. 7, a plurality of light emitting elements 300 having different diameters may also be between the first electrode 210 and the second electrode 220 as described above. The light emitting element 300 will be described in more detail herein below.

A second insulating layer 520 may be on the light emitting element 300 to overlap at least a part of the light emitting element 300. The second insulating layer 520 may protect the light emitting element 300 while fixing the light emitting element 300 between the first electrode 210 and the second electrode 220.

Although the second insulating layer 520 is only on an upper surface of the light emitting element 300 in the cross-sectional view of FIG. 7, it may also cover an outer surface of the light emitting element 300. For example, like the first insulating layer 510, the second insulating layer 520 may extend in the second direction D2 in an island shape or a linear shape along the space between the first electrode branch portion 210B and the second electrode branch portion 220B.

In addition, a portion of the material of the second insulating layer 520 may also be in an area where a lower surface of the light emitting element 300 contacts the first insulating layer 510. This portion may be formed when the light emitting element 300 is aligned on the first insulating layer 510 and the second insulating layer 520 is placed on the light emitting element 300 during the manufacture of the display panel 10. If a gap is formed in the first insulating layer 510 in contact with the lower surface of the light emitting element 300, a portion of the material of the second insulating layer 520 may penetrate into the gap during the formation of the second insulating layer 520.

The second insulating layer 520 exposes both side surfaces of the light emitting element 300. For example, the second insulating layer 520 on the upper surface of the light emitting element 300 in cross section may be shorter in length measured in one axial direction than the light emitting element 300. Thus, the second insulating layer 520 may be recessed further in than both side surfaces of the light emitting element 300. Accordingly, the side surfaces of the first insulating layer 510, the light emitting element 300 and the second insulating layer 520 may be stacked in a staircase pattern. In this case, the contact electrodes 261 and 262 to be further described herein below may smoothly contact the side surfaces of both ends of the light emitting element 300. However, the present disclosure is not limited to this case, and the length of the second insulating layer 520 and the length of the light emitting element 300 may also be equal such that both sides of the second insulating layer 520 are aligned with both sides of the light emitting element 300.

The second insulating layer 520 may be formed to cover the first insulating layer 510 and then patterned in an area, for example, in an area where the light emitting element 300 is exposed to contact the contact electrodes 260. The patterning of the second insulating layer 260 may be performed by any suitable dry etching and/or wet etching generally used in the art. Here, the first insulating layer 510 and the second insulating layer 520 may include materials having different etch selectivities in order to prevent or reduce patterning of the first insulating layer 510. In other words, when the second insulating layer 520 is patterned, the first insulating layer 510 may function as an etching stopper.

Accordingly, even if the second insulating layer 520 is patterned to cover the outer surface of the light emitting element 300 and expose both ends of the light emitting element 300, the material of the first insulating layer 510 is not damaged. In some embodiments, the first insulating layer 510 and the light emitting element 300 may form a smooth contact surface at both ends of the light emitting element 300 where the light emitting element 300 and the contact electrodes 260 contact each other.

The first contact electrode 261 on the first electrode 210 and overlapping at least a part of the second insulating layer 520 and the second contact electrode 262 on the second electrode 220 and overlapping at least a part of the second insulating layer 520 may be on the second insulating layer 520.

The first contact electrode 261 and the second contact electrode 262 may be on the upper surfaces of the first electrode 210 and the second electrode 220, respectively. For example, the first contact electrode 261 and the second contact electrode 262 may respectively contact the first electrode layer 212 and the second electrode layer 222 in areas where the first insulating layer 510 is patterned to partially expose the first electrode 210 and the second electrode 220. Each of the first contact electrode 261 and the second contact electrode 262 may contact a side surface of one end of the light emitting element 300, for example, the first conductivity type semiconductor 310, the second conductivity type semiconductor 320, or the electrode material layer 370. Accordingly, the first contact electrode 261 and the second contact electrode 262 may transmit electrical signals, which are applied to the first electrode layer 212 and the second electrode layer 222, to the light emitting element 300.

The first contact electrode 261 may be on the first electrode 210 to partially cover the first electrode 210, and a lower surface of the first contact electrode 261 may partially contact the light emitting element 300, the first insulating layer 510 and the second insulating layer 520. An end of the first contact electrode 261 in a direction in which the second electrode 262 is located is on the second insulating layer 520. The second contact electrode 262 may be on the second electrode 220 to partially cover the second electrode 220, and a lower surface of the second contact electrode 262 may partially contact the light emitting element 300, the first insulating layer 510 and a third insulating layer 530. An end of the second contact electrode 262 in a direction in which the first contact electrode 261 is located is on the third insulating layer 530.

Regions of the first insulating layer 510 and the second insulating layer 520 which cover the first electrode 210 and the second electrode 220 on upper surfaces of the first bank 410 and the second bank 420 may be patterned. Accordingly, the first electrode layer 212 and the second electrode layer 222 of the first electrode 210 and the second electrode 220 may be exposed and electrically coupled to the contact electrodes 261 and 262 in the exposed regions, respectively.

The first contact electrode 261 and the second contact electrode 262 may be spaced part from each other on the second insulating layer 520 or the third insulating layer 530. For example, both the first contact electrode 261 and the second contact electrode 262 may contact the light emitting element 300 and the second insulating layer 520 or the third insulating layer 530, but may be spaced apart from each other on the second insulating layer 520 in the stacked direction and thus electrically insulated from each other. Accordingly, the first contact electrode 261 and the second contact electrode 262 may receive different power from the first thin-film transistor 120 and the power wiring 161. For example, the first contact electrode 261 may receive a driving voltage applied from the first thin-film transistor 120 to the first electrode 210, and the second contact electrode 262 may receive a common power supply voltage applied from the power wiring 161 to the second electrode 220. However, the present disclosure is not limited to this case.

The contact electrodes 261 and 262 may include a conductive material such as, but not limited to, ITO, IZO, ITZO, or aluminum (Al).

In addition, the contact electrodes 261 and 262 may include the same (e.g., substantially the same) material as the electrode layers 212 and 222. The contact electrodes 261 and 262 may be on the electrode layers 212 and 222 in substantially the same pattern as the electrode layers 212 and 222 so as to contact the electrode layers 212 and 222. For example, the first contact electrode 261 and the second contact electrode 262 in contact with the first electrode layer 212 and the second electrode layer 222 may receive electrical signals applied to the first electrode layer 212 and the second electrode layer 222 and transmit the received electrical signals to the light emitting element 300.

The third insulating layer 530 may be on the first contact electrode 261 to electrically insulate the first contact electrode 261 and the second contact electrode 262 from each other. The third insulating layer 530 may cover the first contact electrode 261 and may not overlap a part of the light emitting element 300 so that the light emitting element 300 can contact the second contact electrode 262. On an upper surface of the second insulating layer 520, the third insulating layer 530 may partially contact the first contact electrode 261, the second contact electrode 262 and the second insulating layer 520. The third insulating layer 530 may cover an end of the first contact electrode 261 on the upper surface of the second insulating layer 520. Accordingly, the third insulating layer 530 may protect the first contact electrode 261 while electrically insulating the first contact electrode 261 from the second contact electrode 262.

An end of the third insulating layer 530 in a direction in which the second electrode 220 is located may be aligned with a side surface of the second insulating layer 520.

In some embodiments, the third insulating layer 530 may be omitted from the display panel 10. Accordingly, the first contact electrode 261 and the second contact electrode 262 may be in substantially the same plane and may be electrically insulated from each other by a passivation layer 550 to be described below.

The passivation layer 550 may be formed on the third insulating layer 530 and the second contact electrode 262 to protect the members on the insulating substrate layer 200 from the external environment. If the first contact electrode 261 and the second contact electrode 262 are exposed, a contact electrode material can be broken due to electrode damage. Therefore, the first contact electrode 261 and the second contact electrode 262 may be covered with the passivation layer 550. For example, the passivation layer 550 may cover the first electrode 210, the second electrode 220, the light emitting element 300, etc. In addition, if the third insulating layer 530 is omitted as described above, the passivation layer 550 may be formed on the first contact electrode 261 and the second contact electrode 262. In this case, the passivation layer 550 may electrically insulate the first contact electrode 261 and the second contact electrode 262 from each other.

Each of the first insulating layer 510, the second insulating layer 520, the third insulating layer 530, and the passivation layer 550 described above may include an inorganic insulating material. For example, the first insulating layer 510, the second insulating layer 520, the third insulating layer 530, and the passivation layer 550 may include a material such as silicon oxide (SiOx), silicon nitride (SiNx), silicon oxynitride (SiOxNy), aluminum oxide ($Al_2O_3$), or aluminum nitride (AlN). The first insulating layer 510, the second insulating layer 520, the third insulating layer 530 and the passivation layer 550 may be made of the same material or different materials. Also, various suitable materials that give an insulating property to the first insulating layer 510, the second insulating layer 520, the third insulating layer 530 and the passivation layer 550 are applicable.

The first insulating layer 510 and the second insulating layer 520 may have different etch selectivities as described above. In an example, when the first insulating layer 510 includes silicon oxide (SiOx), the second insulating layer 520 may include silicon nitride (SiNx). In another example, when the first insulating layer 510 includes silicon nitride (SiNx), the second insulating layer 520 may include silicon oxide (SiOx). However, the present disclosure is not limited to this case.

Figure 8:
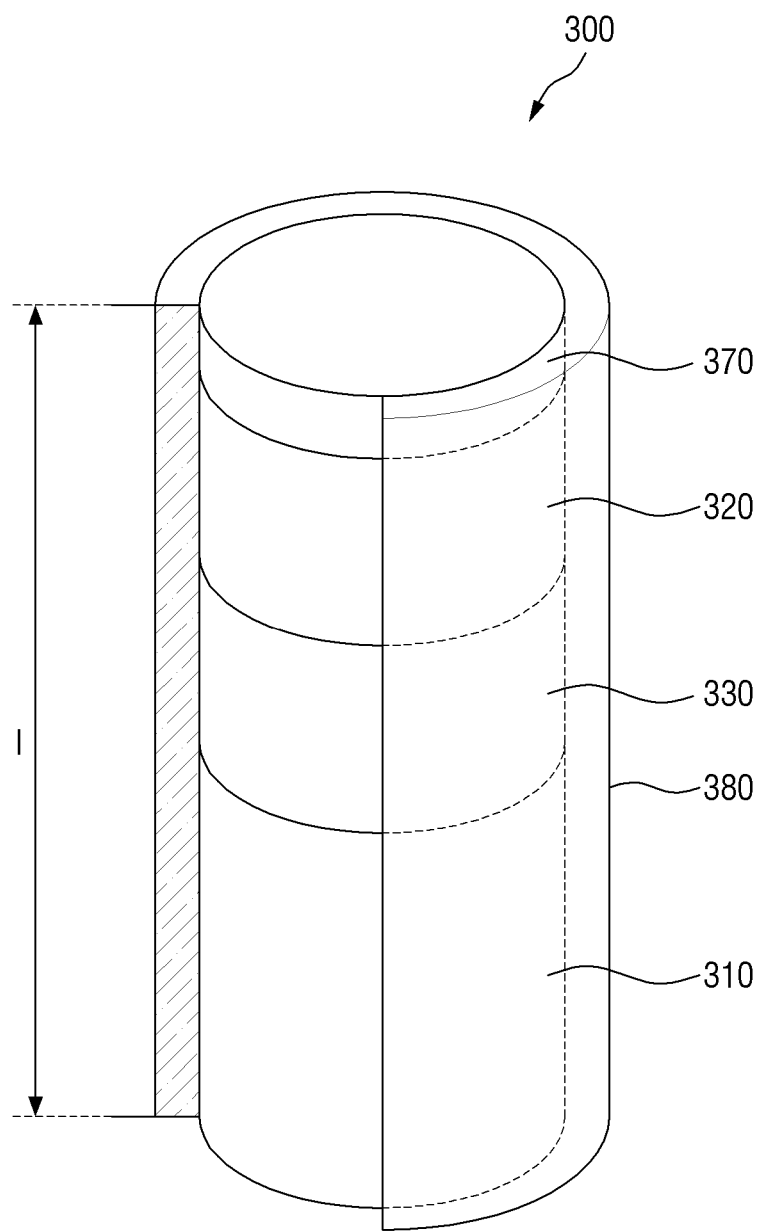
FIG. 8 is a schematic view of a light emitting element according to an embodiment.

The light emitting element 300 may be manufactured on a substrate by an epitaxial growth method. A seed crystal layer for forming a semiconductor layer may be formed on a substrate, and a desired semiconductor material may be deposited and grown. The structures of light emitting elements 300 according to various embodiments will now be described in more detail with reference to FIG. 8. FIG. 8 is a schematic view of a light emitting element according to an embodiment.

Referring to FIG. 8, the light emitting element 300 may include a plurality of conductivity type semiconductors 310 and 320, an element active layer 330, an electrode material layer 370 and an insulating material layer 380. Electrical signals applied from a first electrode 210 and a second electrode 220 may be transmitted to the element active material layer 330 through the conductivity type semiconductors 310 and 320. As a result, light may be emitted.

In some embodiments, the light emitting element 300 may include the first conductivity type semiconductor 310, the second conductivity type semiconductor 320, the element active layer 330 between the first conductivity type semiconductor 310 and the second conductivity type semiconductor 320, the electrode material layer 370 on the second conductivity type semiconductor 320, and the insulating material layer 380 covering outer circumferential surfaces of the above layers. The insulating material layer 380 may contact the first conductivity type semiconductor 310, the second conductivity type semiconductor 320, the element active layer 330 and the electrode material layer 370 and cover the outer circumferential surfaces of the above layers. The light emitting element 300 of FIG. 8 has a structure in which the first conductivity type semiconductor 310, the element active layer 330, the second conductivity type semiconductor 320 and the electrode material layer 370 are sequentially formed in a longitudinal direction, but the present disclosure is not limited to this case. The electrode material layer 370 may also be omitted, and, in some embodiments, may be on at least any one of both side surfaces of each of the first conductivity type semiconductor 310 and the second conductivity type semiconductor 320. The light emitting element 300 of FIG. 8 will be described below as an example, and it should be apparent to those of ordinary skill in the art that the following description of the light emitting element 300 is also applicable even if the light emitting element 300 further includes another structure.

The first conductivity type semiconductor 310 may be an n-type semiconductor layer. In an example, if the light emitting element 300 emits light in a blue wavelength band, the first conductivity type semiconductor 310 may be a semiconductor material having a chemical formula of $In_xAl_yGa_{1-x-y}N$ ($0 \leq x \leq 1$, $0 \leq y \leq 1$, $0 \leq x+y \leq 1$). For example, the first conductivity type semiconductor 310 may be any one or more of n-type doped InAlGaN, GaN, AlGaN, InGaN, AlN and InN. The first conductivity type semiconductor 310 may be doped with a first conductive dopant. The first conductive dopant may be, for example, Si, Ge, or Sn. The length of the first conductivity type semiconductor 310 may be in the range of, but not limited to, about 1.5 µm to about 5 µm.

The second conductivity type semiconductor 320 may be a p-type semiconductor layer. In an example, if the light emitting element 300 emits light in the blue wavelength band, the second conductivity type semiconductor 320 may be a semiconductor material having a chemical formula of $In_xAl_yGa_{1-x-y}N$ ($0 \leq x \leq 1$, $0 \leq y \leq 1$, $0 \leq x+y \leq 1$). For example, the second conductivity type semiconductor 320 may be any one or more of p-type doped InAlGaN, GaN, AlGaN, InGaN, AlN and InN. The second conductivity type semiconductor 320 may be doped with a second conductive dopant. The second conductive dopant may be, for example, Mg, Zn, Ca, Se or Ba. The length of the second conductivity type semiconductor 320 may be in the range of, but not limited to, about 0.08 µm to about 0.25 µm.

The element active layer 330 may be between the first conductivity type semiconductor 310 and the second conductivity type semiconductor 320 and may include a material having a single or multiple quantum well structure. When the element active layer 330 includes a material having a multiple quantum well structure, it may have a structure in which a plurality of quantum layers and a plurality of well layers are alternately stacked. The element active layer 330 may emit light through combination of electron-hole pairs according to electrical signals received through the first conductivity type semiconductor 310 and the second conductivity type semiconductor 320. For example, if the element active layer 330 emits light in the blue wavelength band, it may include a material such as AlGaN or AlInGaN. In some embodiments, if the element active layer 330 has a multiple quantum well structure in which quantum layers and well layers are alternately stacked, the quantum layers may include a material such as AlGaN or AlInGaN, and the well layers may include a material such as GaN or AlGaN. However, the present disclosure is not limited to this case, and the element active layer 330 may also have a structure in which a semiconductor material having a large band gap energy and a semiconductor material having a small band gap energy are alternately stacked or may include different group 3 or 5 semiconductor materials depending on the wavelength band of emitted light. Accordingly, light emitted from the element active layer 330 is not limited to light in the blue wavelength band, but may also be light in a red or green wavelength band in some cases. The length of the element active layer 330 may be in the range of, but not limited to, about 0.05 µm to about 0.25 µm.

Light emitted from the element active layer 330 may be emitted not only to an outer surface of the light emitting element 300 in the longitudinal direction but also to both side surfaces. For example, the direction of light emitted from the element active layer 330 is not limited to one direction.

The wavelength band of light emitted from the element active layer 330 of the light emitting element 300 may vary according to the composition of the element active layer 330. In some embodiments, the element active layer 330 may emit light of a different color according to the type (or composition) of active material in the element active layer 330. However, even if the element active layer 330 includes the same (e.g., substantially the same) kind of active material, its emission wavelength may vary according to the composition ratio in the element active layer 330 and the lattice strain of semiconductor crystals. In other words, the element active layer 330 may have a certain bandgap energy by including the same (e.g., substantially the same) kind of active material, but the bandgap energy may vary according to the lattice strain of active material crystals formed in the element active layer 330 during the manufacture of the light emitting element 300. Accordingly, the wavelength band of emitted light may vary.

Here, if a plurality of light emitting elements 300 are formed to have different diameters, the lattice strain of active material crystals contained in the element active layer 330 of each light emitting element 300 may be different. The different lattice strains of the light emitting elements 300 may cause the element active layers 330 to have different bandgap energies, resulting in different wavelengths of emitted light.

Therefore, based on a light emitting element 300 which emits light of a certain wavelength band, it is possible to control the emission wavelength of another light emitting element 300 which emits light of a wavelength band different from that of the light emitted from the above light emitting element 300 by adjusting the diameter of the another light emitting element 300.

The electrode material layer 370 may be an ohmic contact electrode. However, the electrode material layer 370 is not limited to the ohmic contact electrode and may also be a Schottky contact electrode. The electrode material layer 370 may include a conductive metal. For example, the electrode material layer 370 may include at least any one of aluminum (Al), titanium (Ti), indium (In), gold (Au), silver (Ag), indium tin oxide (ITO), indium zinc oxide (IZO), and indium tin-zinc oxide (ITZO). The electrode material layer 370 may include the same material or different materials, but the present disclosure is not limited to this case.

The insulating material layer 380 may be formed outside the first conductivity type semiconductor 310, the second conductivity type semiconductor 320, the element active layer 330 and the electrode material layer 370 and protect these layers. For example, the insulating material layer 380 may surround side surfaces of the above layers and may not be formed at both ends of the light emitting element 300 in the longitudinal direction, for example, at both ends where the first conductivity type semiconductor 310 and the electrode material layer 370 are provided. However, the present disclosure is not limited to this case.

The insulating material layer 380 may include an insulating material such as silicon oxide ($SiO_x$), silicon nitride ($SiN_x$), silicon oxynitride ($SiO_xN_y$), aluminum nitride (AlN), or aluminum oxide ($Al_2O_3$). Accordingly, it is possible to prevent or reduce a likelihood or degree of an electrical short circuit that may occur when the element active layer 330 directly contacts the first electrode 210 or the second electrode 220. In addition, because the insulating material layer 380 protects the outer circumferential surface of the light emitting element 300 including the element active layer 330, a reduction in luminous efficiency can be prevented or reduced.

Although the insulating material layer 380 extends in the longitudinal direction to cover from the first conductivity type semiconductor 310 to the electrode material layer 370, the present disclosure is not limited to this case. The insulating material layer 380 may also cover only the first conductivity type semiconductor 310, the element active layer 330 and the second conductivity type semiconductor 320 or may cover only a part of the outer surface of the electrode material layer 370 to expose a part of the outer surface of the electrode material layer 370.

The thickness of the insulating material layer 380 may be in the range of, but not limited to, about 0.5 μm to about 1.5 μm.

In addition, in some embodiments, the outer circumferential surface of the insulating material layer 380 may be treated. As described above, in order to align the light emitting element 300 between the electrodes 210 and 220, a solution in which a plurality of light emitting elements 300 are dispersed may be coated. Here, the surface of the insulating material layer 380 may be hydrophobic or hydrophilic-treated so that the light emitting element 300 is kept separate in the solution without being agglomerated with other adjacent light emitting elements 300. Accordingly, the light emitting element 300 can be aligned between the first electrode 210 and the second electrode 220 without being agglomerated.

The light emitting element 300 may be cylindrical. Accordingly, a cross section of the light emitting element 300 taken across both ends of the light emitting element 300 in the longitudinal direction may have a quadrilateral shape. However, the light emitting element 300 is not limited to the quadrilateral shape and may also have various suitable shapes such as a cube, a rectangular parallelepiped, and a hexagonal prism. The light emitting element 300 may have a length of about 1 μm to about 10 μm, or about 2 μm to about 5 μm, or, for example, a length of about 4 μm. In addition, the light emitting element 300 may have a diameter of 300 nm to 700 nm. As described above, the light emitting elements 300 included in the display panel 10 may have different diameters according to the compositions of their respective element active layers 330. The diameters of the light emitting elements 300 may be about 500 nm.

A method of manufacturing a light emitting element 300 according to an embodiment will now be described with reference to FIGS. 9 through 13.

FIGS. 9 through 13 are schematic views illustrating a method of manufacturing a display panel according to an embodiment.

Figure 9:
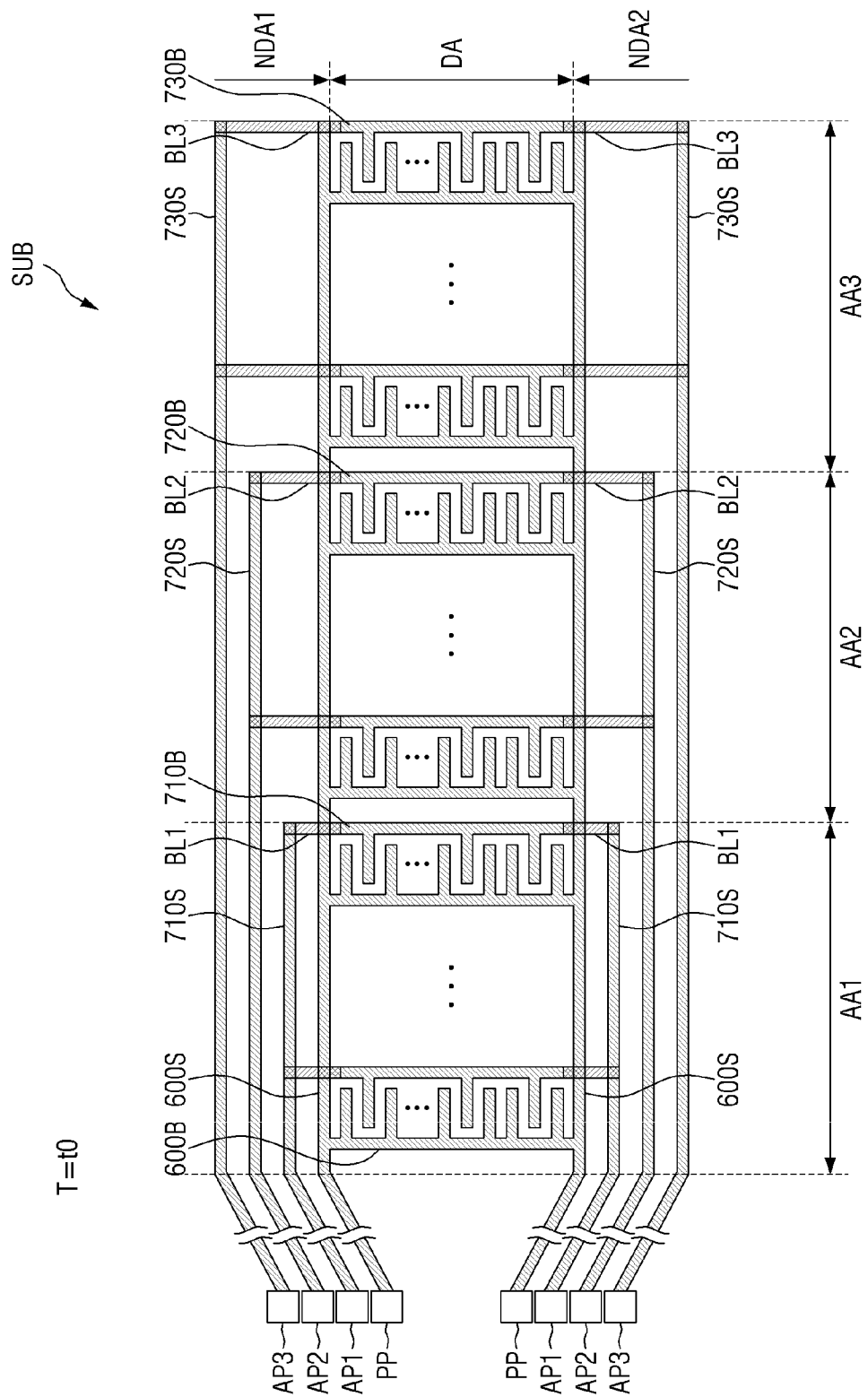
FIGS. 9 through 13 are schematic views illustrating a method of manufacturing a display panel according to an embodiment.

First, referring to FIG. 9, a ground wiring 600, a first alignment wiring 710, a second alignment wiring 720 and a third alignment wiring 730 are placed on a lower substrate SUB of a display panel 10. The arrangement structure of the ground wiring 600 and the alignment wirings 710 through 730 is as described above with reference to FIG. 5. A display area DA, a non-display area NDA, a first alignment area AA1, a second alignment area AA2 and a third alignment area AA3 may also be defined in the lower substrate SUB of the display panel 10 of FIG. 9.

Each ground wiring branch portion 600B of FIG. 9 may be formed as a single piece, unlike in FIG. 5. The ground wiring branch portions 600B of FIG. 5 may be formed by cutting each ground wiring branch portion 600B after aligning light emitting elements 300 between each ground wiring branch portion 600B and each alignment wiring branch portion 700B.

Figure 10:
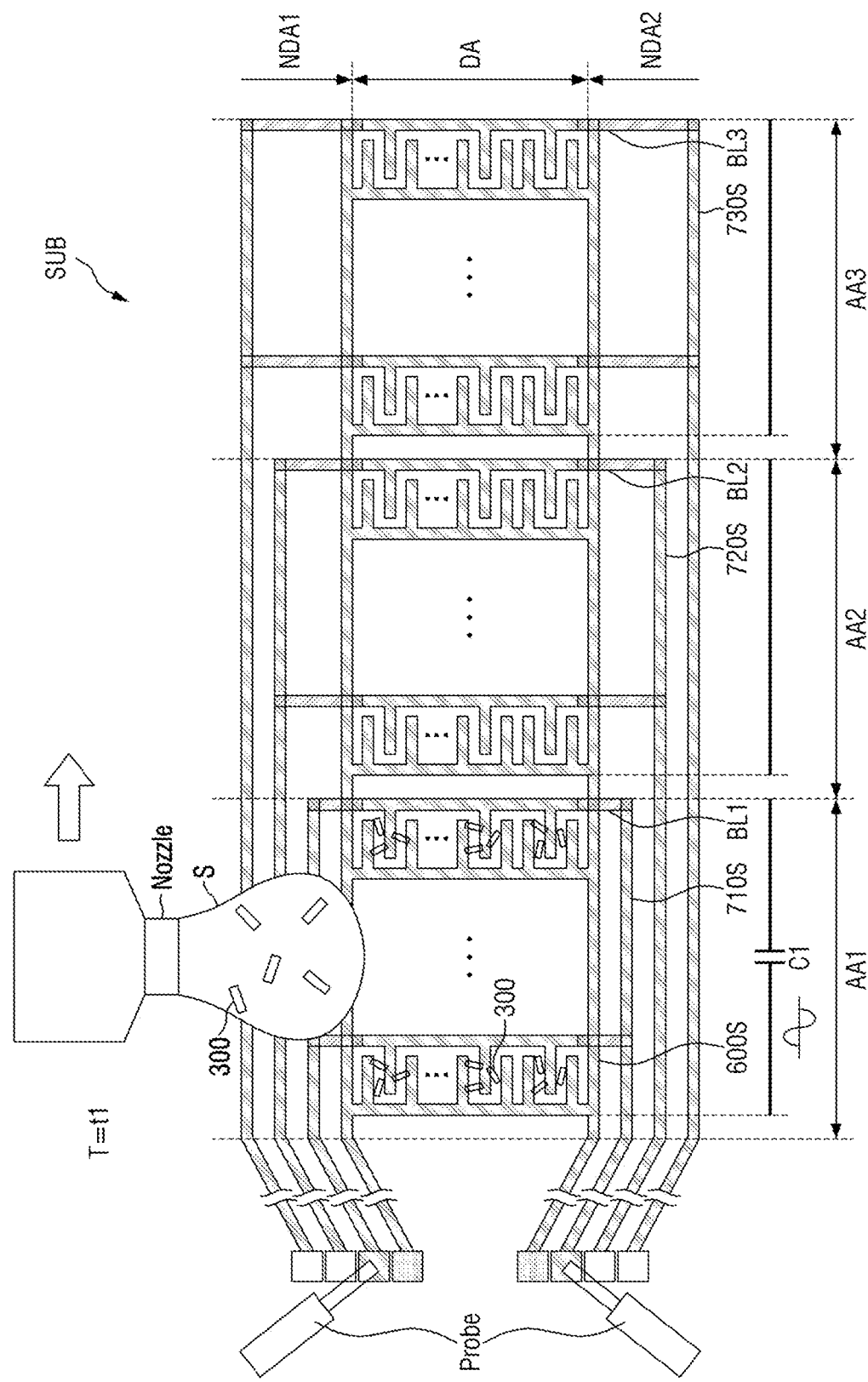
Figure 11:
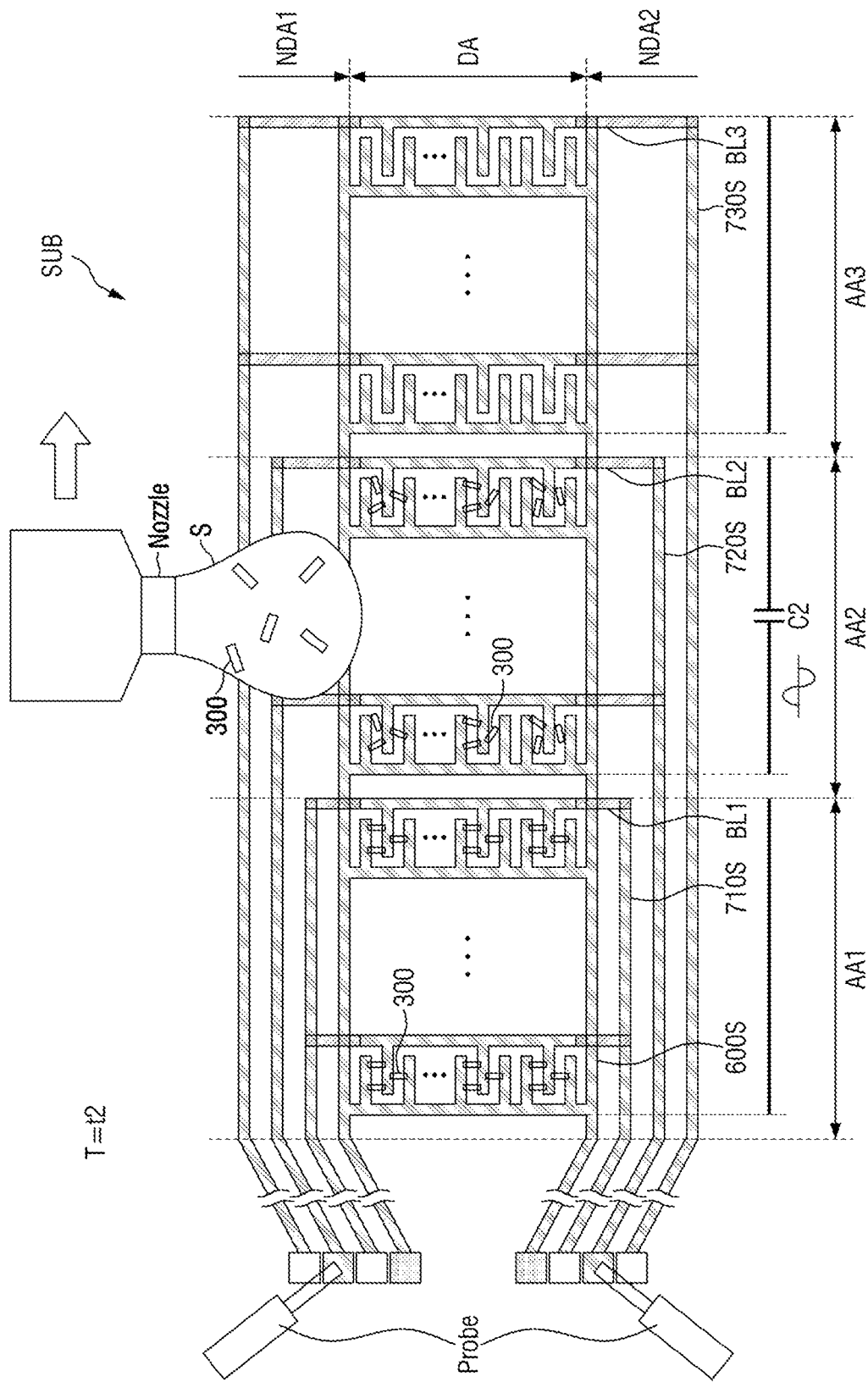
Figure 12:
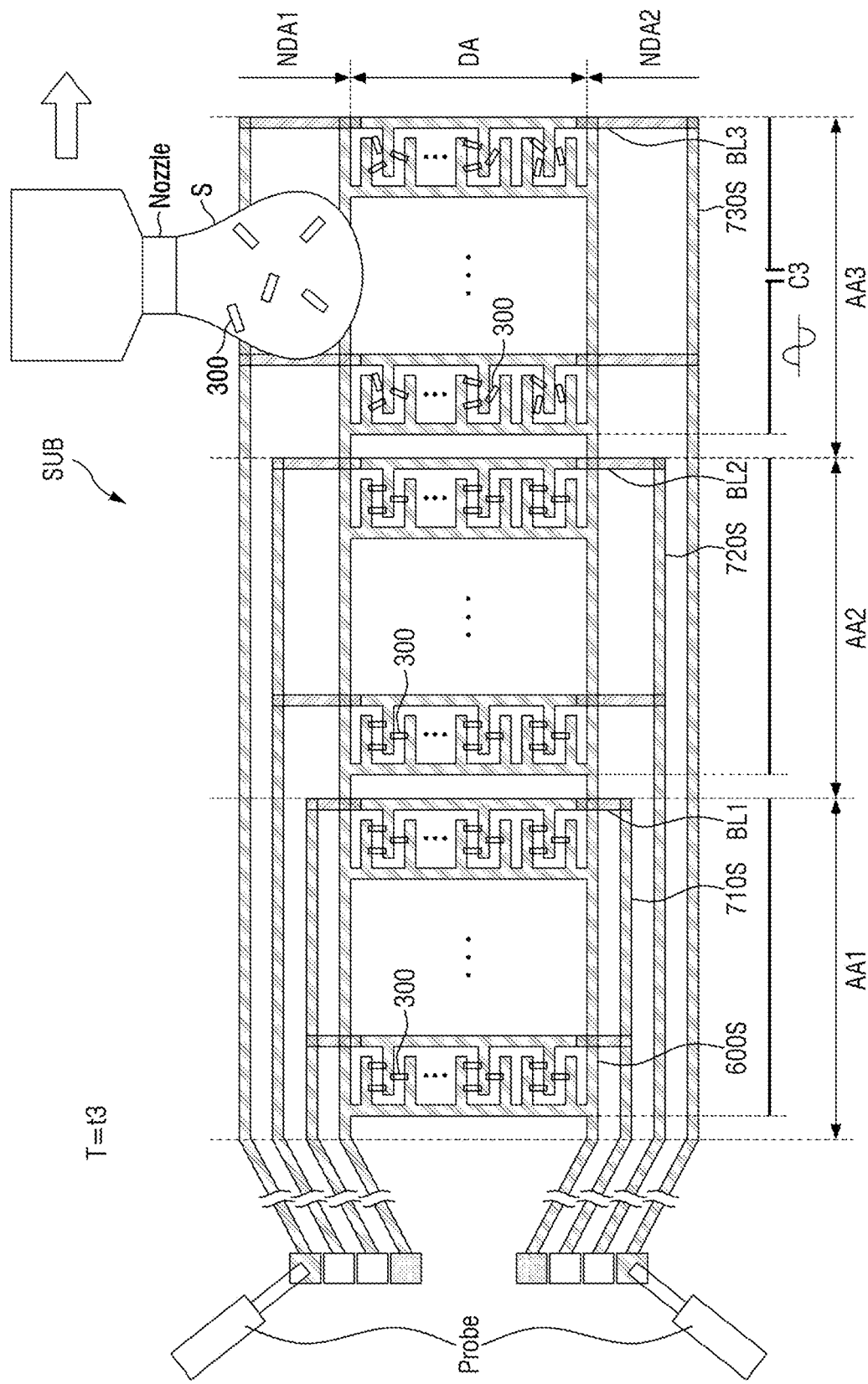

Next, referring to FIGS. 10 through 12, a coating solution S containing the light emitting elements 300 is coated on the alignment areas AA, and an alignment signal is applied through each alignment wiring 700.

The coating solution S containing the light emitting elements 300 may be coated on the lower substrate SUB of the display panel 10 through a nozzle. In an example, the process of coating the light emitting elements 300 may be performed by inkjet printing or Die-slot coating. In an exemplary embodiment, inkjet printing may be used.

The light emitting elements 300 may be coated on the display area DA defined in the lower substrate SUB of the display panel 10 by using the nozzle. The order of coating the light emitting elements 300 is not particularly limited. For example, the light emitting elements 300 may be coated sequentially from a first side of the first alignment area AA1 to a second side of the third alignment area AA3 in the second direction D2.

Although the nozzle moves only in the second direction D2 in the drawings, the present disclosure is not limited to this case. In some cases, the nozzle may apply the coating solution S while moving also in the first direction D1 or other directions in the alignment areas AA. For example, when the amount of the coating solution S ejected from the nozzle is not sufficient to cover each alignment area AA, the nozzle may repeat an operation of moving in another direction, for example, in the first direction D1 or another direction and then moving in the second direction D2 again. The movement direction of the nozzle is not particularly limited as long as the coating solution S can be coated on the first alignment area AA1, the second alignment area AA2 and the third alignment area AA3 of the display panel 10.

First, in aligning the light emitting elements 300, the coating solution S is not coated at an initial time (T=t0). In addition, no alignment signal may be transmitted to each alignment wiring 710, 720 or 730.

The coating solution S containing the light emitting elements 300 may be coated on at least a part of the first alignment area AA1 at a first time (T=t1), may be coated on at least a part of the second alignment area AA2 at a second time (T=t2), and may be coated on at least a part of the third alignment area AA3 at a third time (T=t3). For example, the nozzle for applying the coating solution S may move sequentially from the first alignment area AA1 to the second alignment area AA2 and the third alignment area AA3.

According to an embodiment, at a time t when the light emitting elements 300 are coated on an alignment area AA, an alignment signal may be applied only to the alignment wiring branch portions 700B in the alignment area AA on which the light emitting elements 300 are coated during the manufacture of the display panel 10. In other words, the time t when the light emitting elements 300 are coated on the alignment area AA may be the same (e.g., substantially the same) as the time when an alignment signal is applied to the alignment wiring 700 in the alignment area AA.

First, the ground wiring 600 may be kept grounded during the first time t1, the second time t2 and the third time t3 at which the coating solution S is coated. Accordingly, an electric field-induced capacitance may be formed in a corresponding alignment area AA according to an alignment signal applied to the alignment wiring branch portions 700B facing the ground wiring branch portions 600B at each time t.

In the case of the alignment wiring 700, when the coating solution S is coated on an alignment area AA, an alignment signal may be applied only to an alignment wiring 710, 720 or 730 whose alignment wiring branch portions 700B are in the alignment area AA.

For example, at the first time t1 when the light emitting elements 300 are coated on the first alignment area AA1, an alignment signal is applied to the first alignment wiring 710 from first signal application pads AP1 through probes coupled to an external power source. On the other hand, no alignment signal may be applied to the second alignment wiring 720 and the third alignment wiring 730 at the first time t1. Accordingly, at the first time t1, an electric field-induced capacitance C1 may be formed only in the first alignment area AA1, and a capacitance C may not be formed in the second alignment area AA2 and the third alignment area AA3.

Next, at the second time t2 when the light emitting elements 300 are coated on the second alignment area AA2, an alignment signal may be applied to the second alignment wiring 720 from second signal application pads AP2 but may not be applied to the first alignment wiring 710 and the third alignment wiring 730. Accordingly, at the second time t2, a capacitance C2 may be formed only in the second alignment area AA2, and a capacitance C may not be formed in the first alignment area AA1 and the third alignment area AA3.

Next, at the third time t3 when the light emitting elements 300 are coated on the third alignment area AA3, an alignment signal may be applied to the third alignment wiring 730 from third signal application pads AP3 but may not be applied to the first alignment wiring 710 and the second alignment wiring 720. Accordingly, at the third time t3, a capacitance C2 may be formed only in the third alignment area AA3, and a capacitance C may not be formed in the first alignment area AA1 and the second alignment area AA2.

When the light emitting elements 300 are coated on an alignment area AA at a time t, an alignment signal may be applied only to the alignment area AA to form a capacitance C on a part of the display panel 10. The time t when the light emitting elements 300 are coated on the alignment area AA may be synchronized with the time when an alignment signal is applied to the alignment area AA. Accordingly, it is possible to prevent or reduce misalignment of the light emitting elements 300 coated on the alignment area AA on another alignment area AA adjacent to the alignment area AA.

In addition, in the case of the second alignment wiring 720 and the third alignment wiring 730, second alignment wiring branch portions 720B are not in the first alignment area AA1 and the third alignment area AA3, and third alignment wiring branch portions 730B are not in the first alignment area AA1 and the second alignment area AA2. This minimizes or reduces the unnecessary resistance value of each alignment wiring 700, thereby minimizing or reducing the drop of a voltage applied.

For example, when the light emitting elements 300 are aligned in the second alignment area AA2 through the second alignment wiring 720, no capacitance is formed in the first alignment area AA1 because the second alignment wiring branch portions 720B are not in the first alignment area AA1. This means that a voltage applied from the second signal application pads AP2 is not consumed to form an unnecessary capacitance. Accordingly, a high voltage can be applied to the second alignment area AA2 located relatively far from the second signal application pads AP2, and a voltage sufficient to align the light emitting elements 300 can be applied to the second alignment wiring branch portions 720B. It should be apparent to those of ordinary skill in the art that the same is true for the first alignment wiring 710 and the third alignment wiring 730, and thus a duplicative description of the first alignment wiring 710 and the third alignment wiring 730 will not be repeated here.

In other words, the light emitting elements 300 can be aligned using a different alignment wiring 700 for each alignment area AA of the display panel 10. Accordingly, the light emitting elements 300 can be aligned with a uniform (e.g., substantially uniform) degree of alignment over the entire area of the display panel 10, and the maximum applied current value used for the alignment of the light emitting elements 300 can be reduced.

Figure 13:
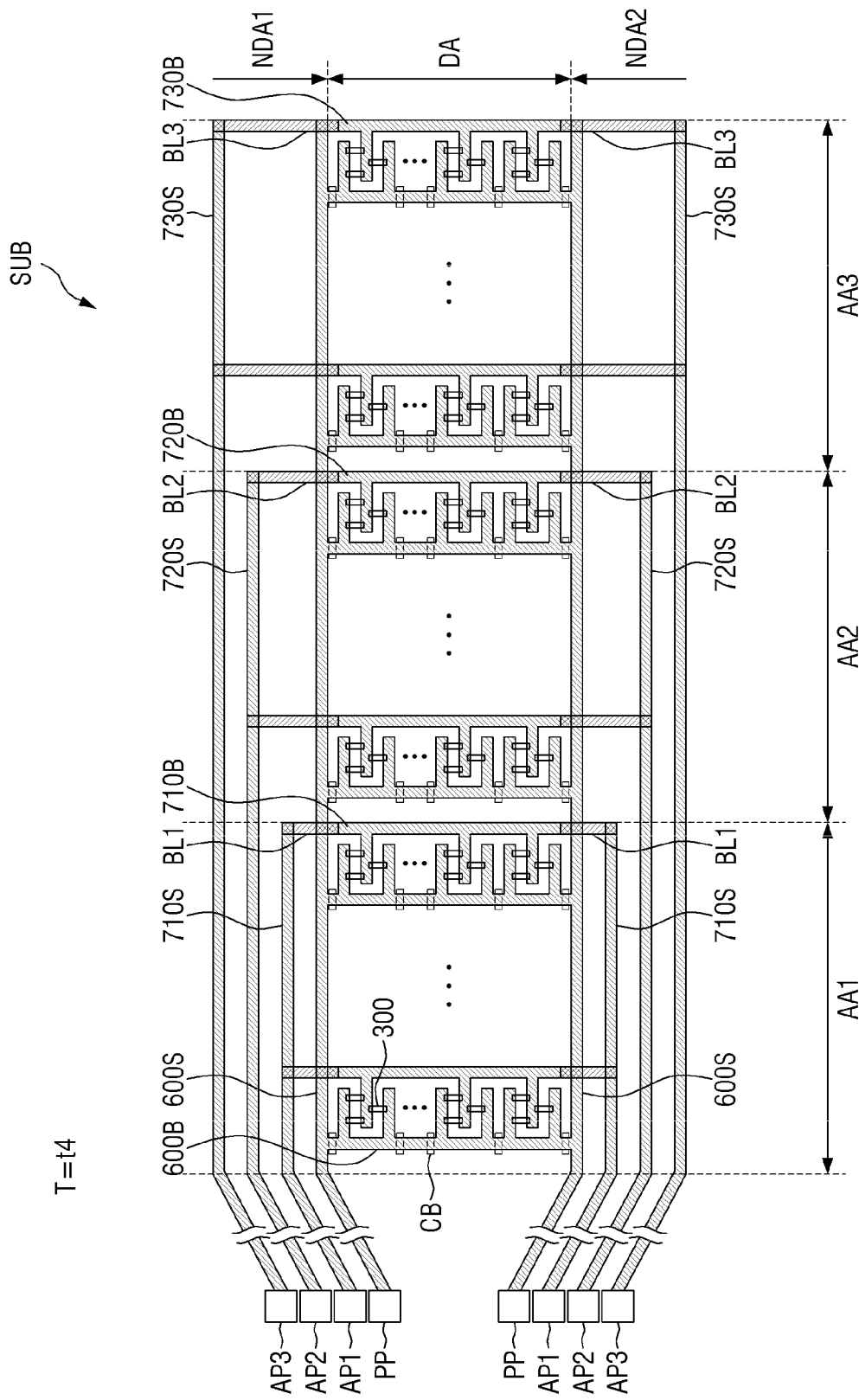

Next, referring to FIG. 13, at a fourth time (T=t4) after the nozzle for applying the coating solution S passes the display panel 10, no alignment signal is applied from the signal application pads AP1 through AP3. The light emitting elements 300 are aligned in each of the alignment areas AA1 through AA3, and the coating solution S is removed by volatilization.

After the light emitting elements 300 are aligned between the ground wiring branch portions 600B and the alignment wiring branch portions 700B in each alignment area AA, each ground wiring branch portion 600B is cut along cutting lines CB. Accordingly, each fragment of each ground wiring branch portion 600B may form one pixel PX or one subpixel PX1, PX2 or PX3 together with an alignment wiring branch portion 700B facing the fragment.

Figure 14:
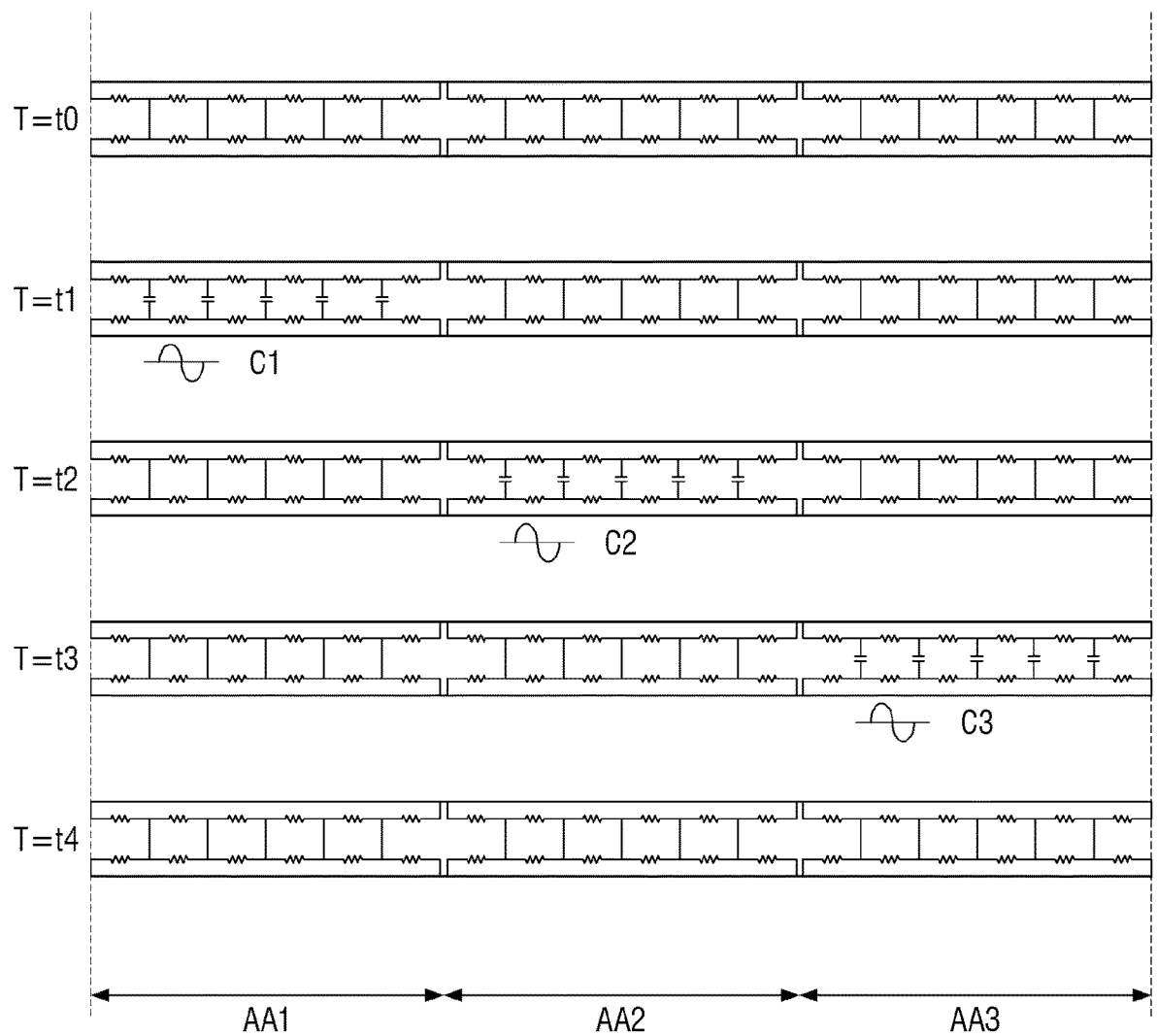
FIG. 14 is a circuit diagram schematically illustrating a capacitance formed in each alignment area during the manufacture of a display panel according to an embodiment.

FIG. 14 is a circuit diagram schematically illustrating a capacitance formed in each alignment area during the manufacture of a display panel according to an embodiment.

Referring to FIG. 14, the times T in FIGS. 9 through 13 described above can be understood as the initial time t0, the first time t1, the second time t2, the third time t3, and the fourth time t4, respectively.

First, at the initial time t0, no alignment signal is applied. Therefore, a plurality of ground wirings 600 and a plurality of alignment wirings 700 are placed on the lower substrate SUB of the display panel 10.

Next, at the first time t1, the coating solution S is coated on the first alignment area AA1, and an alignment signal is applied through the first alignment wiring 710. The first alignment wiring branch portions 710B of the first alignment wiring 710 are only in the first alignment area AA1. Accordingly, a capacitance C1 due to an electric field is formed in the first alignment area AA1, and a capacitance C is not formed in the second alignment area AA2 and the third alignment area AA3.

Next, at the second time t2, the coating solution S is coated on the second alignment area AA2, and an alignment signal is applied through the second alignment wiring 720. The second alignment wiring branch portions 720B of the second alignment wiring 720 are only in the second alignment area AA2. Accordingly, a capacitance C2 due to an electric field is formed in the second alignment area AA2, and a capacitance C is not formed in the first alignment area AA1 and the third alignment area AA3. In some embodiments, because the capacitance C2 is formed only in the second alignment area AA2 by passing the first alignment area AA1, the voltage drop of the alignment signal is minimized or reduced. For example, the capacitance C2 formed in the second alignment area AA2 at the second time t2 may have the same (e.g., substantially the same) intensity as the capacitance C1 formed in the first alignment area AA1 at the first time t1. Because the same is true for the third time t3, a duplicative description of the third time t3 will not be repeated here.

Finally, at the fourth time t4, the light emitting elements 300 are aligned in the display area DA. Therefore, no alignment signal is applied to the alignment wirings 710 through 730. For example, a capacitance C due to an electric field is not formed.

Although not illustrated in the drawing, a plurality of members (e.g., contact electrodes 260 and insulating layers) placed on the light emitting elements 300 after the alignment of the light emitting elements 300 may be formed by any suitable patterning process generally used in the art, and therefore, further description thereof is not necessary here.

Next, a structure of a display device 10_1 according to another embodiment will now be described with reference to FIG. 15.

Figure 15:
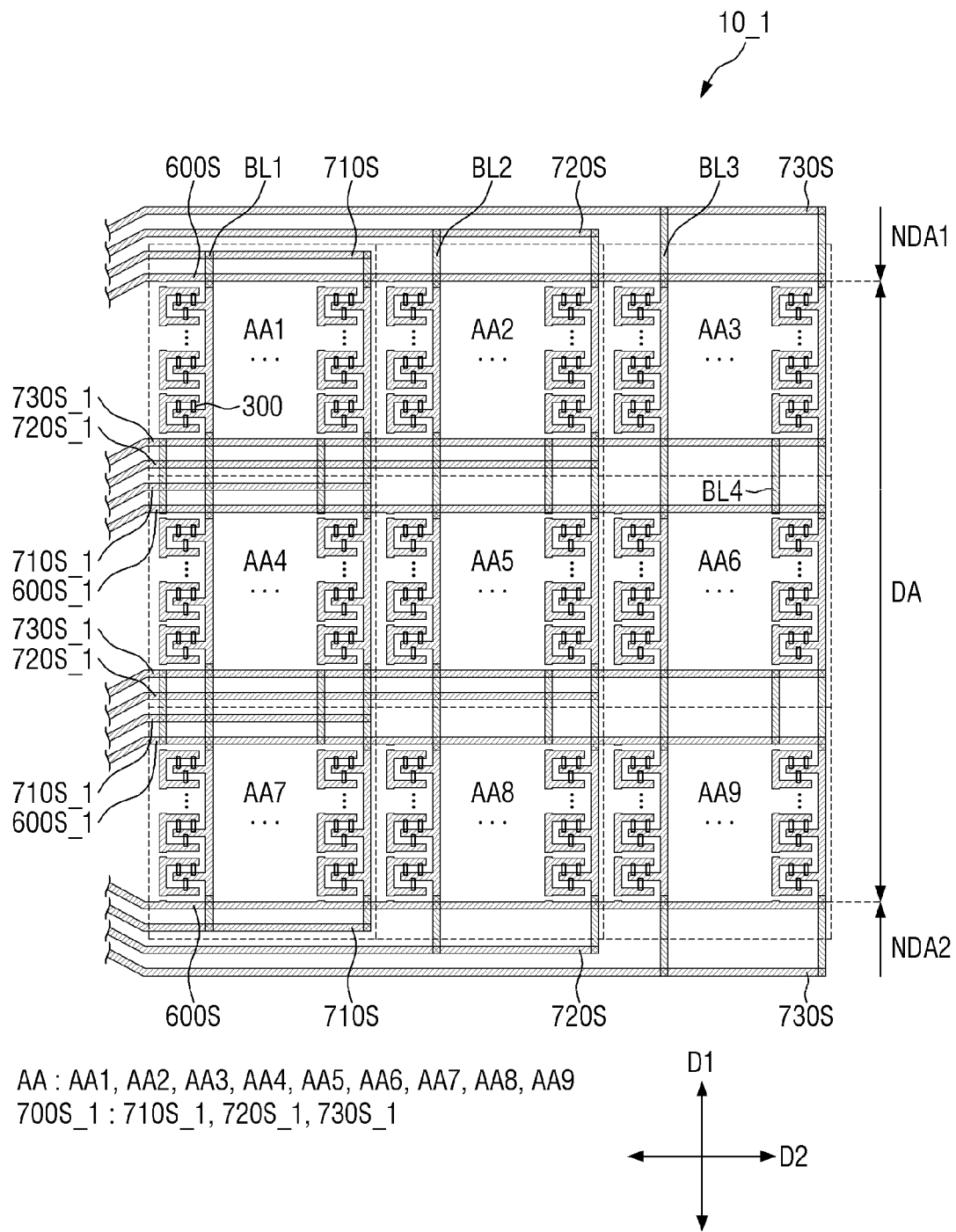
FIG. 15 is a plan view of a display panel according to another embodiment.

FIG. 15 is a plan view of a display panel according to another embodiment.

The display panel 10_1 of FIG. 15 may include a larger number of alignment areas AA than the display panel 10 of FIG. 5. As described above, the alignment areas AA may not necessarily extend in the first direction D1 to have a linear shape. In addition, ground wirings 600 and alignment wirings 700 may be in a display area DA in some cases.

Referring to FIG. 15, in the display panel 10_1 of FIG. 15, a plurality of ground wirings 600 and a plurality of alignment wirings 700 are in a first non-display area NDA1 and a second non-display area NDA2 and may also be in the display area DA. The ground wiring 600 and the alignment wiring 700 in the first non-display area NDA1 and the second non-display area NDA2 are the same as those described above with reference to FIG. 5. Thus, a ground wiring 600_1 and an alignment wiring 700_1 in the display area DA will be described below in more detail.

In FIG. 15, two ground wiring stem portions 600S_1 extend in the display area DA in the second direction D2. The ground wiring stem portions 600S_1 may form one pair with each other while respectively forming one pair with ground wiring stem portions 600S in the first non-display area NDA1 and the second non-display area NDA2. For example, the display panel 10_1 of FIG. 15 may be divided into three areas along the first direction D1 by a total of four ground wiring stem portions 600S and 600S_1.

In addition, a total of six alignment wiring stem portions 700S_1 may extend in the display area DA in the second direction D2. The alignment wiring stem portions 700S_1 include first alignment wiring stem portions 710S_1, second alignment wiring stem portions 720S_1 and third alignment wiring stem portions 730S_1. The alignment wiring stem portions 710S_1, 710S_2 and 710S_3 may respectively form one pair with each other while respectively forming one pair with first alignment wiring stem portions 710S, second alignment wiring stem portions 720S and third alignment wiring stem portions 730S in the first non-display area NDA1 and the second non-display area NDA2.

Each of the alignment wiring stem portions 700S and 700S_1 may extend to a side of the display panel 10 so as to be coupled to a signal application pad (not illustrated) and may extend toward the other side in the second direction D2. As described above, because the alignment wiring stem portions 700S and 700S_1 extend up to different alignment areas AA, they may have different lengths. In FIG. 15, the first alignment wiring stem portions 710S and 710S_1 may extend up to a first alignment area AA1, the second alignment wiring stem portions 720S and 720S_1 may extend up to a second alignment area AA2, and the third alignment wiring stem portions 730S and 730S_1 may extend up to a third alignment area AA3.

Accordingly, the display panel 10_1 of FIG. 15 may be divided into three areas along the second direction D2 by three types (or kinds) of alignment wiring stem portions 710S, 720S and 730S having different lengths.

As described above, an area where each ground wiring stem portion 600S and each alignment wiring stem portion 710S, 720S or 730S overlap may be defined as an alignment area AA. For example, a total of nine alignment areas AA1 through AA9 may be defined in FIG. 15. Different ground wiring branch portions (not illustrated) and alignment wiring branch portions (not illustrated) may be in each alignment area AA.

The ground wiring stem portions 600S and 600S_1 and the alignment wiring stem portions 700S and 700S_1 may have a symmetrical structure with respect to the display area DA or each alignment area AA or may have the same (e.g., substantially the same) structure.

For example, the ground wiring stem portions 600S_1 and the alignment wiring stem portions 710S_1 through 730S_1 in the display area DA may have the same (e.g., substantially the same) structure as the ground wiring stem portion 600S and the alignment wiring stem portions 710S through 730S in the first non-display area NDA1. On the other hand, the ground wiring stem portions 600S_1 and the alignment wiring stem portions 710S_1 through 730S_1 in the display area DA may have a symmetrical structure to the ground wiring stem portion 600S and the alignment wiring stem portions 710S through 730S in the second non-display area NDA2 with respect to a row in which a seventh alignment area AA7 is provided. However, the present disclosure is not limited to this case. In some cases, the ground wiring stem portions 600S_1 and the alignment wiring stem portions 710S_1 through 730S_1 in the display area DA may have a symmetrical structure to the ground wiring stem portion 600S and the alignment wiring stem portions 710S through 730S in the first non-display area NDA1.

In addition, unlike in FIG. 5, the ground wirings 600 of the display panel 10_1 of FIG. 15 may include bridge wirings BL in some parts. The paths of ground wiring branch portions (not illustrated) branching from the ground wiring stem portions 600S_1 in the display area DA may be blocked. Therefore, the ground wiring stem portions 600S_1 may be coupled to the ground wiring branch portions (not illustrated) by fourth bridge wirings BL4.

The display panel 10_1 of FIG. 15 is the same as the display panel 10 of FIG. 5 except that it includes a total of nine alignment areas AA and that the ground wirings 600 further include the fourth bridge wirings BL4. Thus, a redundant description is not repeated here.

While the present disclosure has been shown and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

The invention claimed is:

1. A display device comprising:
   a first area which extends in a first direction;
   a second area which extends in the first direction and is alongside the first area in a second direction crossing the first direction;
   at least one first light emitting element in the first area;
   at least one second light emitting element in the second area;

at least one first wiring coupled to an end of the at least one first light emitting element in the first area, the at least one first wiring extending in the first direction; and at least one second wiring coupled to an end of the at least one second light emitting element in the second area, the at least one second wiring extending in the first direction, wherein the at least one first wiring and the at least one second wiring are electrically isolated from each other, and a length of a first alignment wiring stem portion measured in the second direction is shorter than a length of a second alignment wiring stem portion measured in the second direction.

2. The display device of claim 1, further comprising a third wiring having at least a part extending in the second direction from a first side of the first area to a second side of the second area, wherein the third wiring comprises at least one third wiring branch portion having at least some parts extending in the first area and the second area in the first direction and spaced apart from each other and a third wiring stem portion extending in the second direction.

3. The display device of claim 2, wherein the third wiring branch portion is coupled to the other end of the at least one first light emitting element in the first area and coupled to the other end of the at least one second light emitting element in the second area.

4. The display device of claim 2, wherein the first wiring comprises a first wiring branch portion extending in the first area in the first direction and the first alignment wiring stem portion extending in the second direction from the first side of the first area to a second side of the first area, and the second wiring comprises a second wiring branch portion extending in the second area in the first direction and the second alignment wiring stem portion extending in the second direction from the first side of the first area to the second side of the second area.

5. The display device of claim 4, comprising:
a display area which extends in the second direction; and
a non-display area which extends in the second direction and is located on both sides of the display area in the first direction,
wherein the first wiring stem portion, the second wiring stem portion, and the third wiring stem portion are in the non-display area.

6. The display device of claim 5, wherein the non-display area comprises a first non-display area on a side of the display area and a second non-display area on the other side of the display area.

7. The display device of claim 6, wherein the first wiring comprises the first alignment wiring stem portion in the first non-display area and a first sub-wiring stem portion in the second non-display area, the second wiring comprises the second alignment wiring stem portion in the first non-display area and a second sub-wiring stem portion in the second non-display area, and the third wiring comprises the third wiring stem portion in the first non-display area and a third sub-wiring stem portion in the second non-display area.

8. The display device of claim 7, wherein the third wiring branch portion has an end spaced apart from the third wiring stem portion and an other end spaced apart from the third sub-wiring stem portion, the first wiring branch portion has both ends respectively coupled to the first alignment wiring stem portion and the first sub-wiring stem portion, and the second wiring branch portion has both ends respectively coupled to the second alignment wiring stem portion and the second sub-wiring stem portion.

9. The display device of claim 5, further comprising:
a first wiring layer comprising the first wiring, the second wiring and the third wiring; and
a second wiring layer on the first wiring layer and comprising a first bridge wiring coupling the first alignment wiring stem portion and the first wiring branch portion and a second bridge wiring coupling the second alignment wiring stem portion and the second wiring branch portion.

10. The display device of claim 3, further comprising:
a third area which extends in the first direction and is on the second side of the second area; and
a fourth wiring comprising a fourth wiring stem portion extending from the first side of the first area to a second side of the third area in the second direction and a fourth wiring branch portion branching from the fourth wiring stem portion and in the third area,
wherein the fourth wiring is electrically isolated from the first wiring and the second wiring.

11. The display device of claim 10, wherein the third wiring stem portion extends from the first side of the first area to the second side of the third area in the second direction, and the third wiring branch portion branches from the third wiring stem portion and is in the third area.

12. The display device of claim 11, further comprising a third light emitting element which has an end coupled to the third wiring branch portion in the third area and an other end coupled to the fourth wiring branch portion.

13. A method of manufacturing a display device, the method comprising:
preparing a lower substrate comprising at least one ground wiring and an alignment wiring spaced apart from the at least one ground wiring to face the at least one ground wiring; and
aligning a light emitting element between the at least one ground wiring and the alignment wiring by coating a coating solution containing the light emitting element on at least a part of the lower substrate and applying alternating current (AC) power to the alignment wiring,
wherein the lower substrate comprises a first area extending in a first direction and a second area alongside the first area in a second direction crossing the first direction, and the alignment wiring comprises a first alignment wiring in the first area and a second alignment wiring in the second area, and
a length of a first alignment wiring stem portion measured in the second direction is shorter than a length of a second alignment wiring stem portion measured in the second direction.

14. The method of claim 13, wherein the coating solution is coated sequentially from a first side of the first area to a second side of the second area.

15. The method of claim 14, wherein the at least one ground wiring comprises a first ground wiring spaced apart from the first alignment wiring to face the first alignment wiring in the first area and a second ground wiring spaced apart from the second alignment wiring to face the second alignment wiring in the second area.

16. The method of claim 15, wherein the light emitting element comprises a first light emitting element aligned between the first alignment wiring and the first ground wiring and a second light emitting element aligned between the second alignment wiring and the second ground wiring.

17. The method of claim 16, wherein the aligning of the light emitting element comprises:
   aligning the light emitting element between the first alignment wiring and the first ground wiring by coating the coating solution on at least a part of the first area and applying the AC power to the first alignment wiring at a first time; and
   aligning the light emitting element between the second alignment wiring and the second ground wiring by coating the coating solution on at least a part of the second area and applying the AC current to the second alignment wiring at a second time different from the first time.

18. The method of claim 17, wherein, at the first time, the AC power applied to the first alignment wiring forms a first electric field between the first alignment wiring and the first ground wiring, and the first light emitting element has an end coupled to the first alignment wiring and an other end coupled to the first ground wiring.

19. The method of claim 18, wherein, at the second time, the first electric field is removed, the AC power applied to the second alignment wiring forms a second electric field, which has substantially the same intensity as the first electric field, between the second alignment wiring and the second ground wiring, and
   the second light emitting element has an end coupled to the second alignment wiring and an other end coupled to the second ground wiring.

20. The method of claim 19, wherein, at a third time different from the first time and the second time, the second electric field is removed, and each of the first ground wiring and the second ground wiring is partially patterned to form at least one fragment.

* * * * *